US008304662B2

(12) United States Patent
Saitou et al.

(10) Patent No.: US 8,304,662 B2
(45) Date of Patent: Nov. 6, 2012

(54) BUILDUP BOARD, AND ELECTRONIC COMPONENT AND APPARATUS HAVING THE BUILDUP BOARD

(75) Inventors: Akiyoshi Saitou, Kawasaki (JP); Takeshi Midorikawa, Kawasaki (JP); Toru Kuraishi, Kawasaki (JP); Chikayuki Kumagai, Kawasaki (JP); Masashi Fujimoto, Kawasaki (JP); Kenichiro Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1365 days.

(21) Appl. No.: 11/806,680

(22) Filed: Jun. 1, 2007

(65) Prior Publication Data

US 2007/0295533 A1 Dec. 27, 2007

Related U.S. Application Data

(63) Continuation-in-part of application No. 11/589,102, filed on Oct. 30, 2006, now abandoned.

(30) Foreign Application Priority Data

Jun. 1, 2006 (JP) .................................. 2006-153964
May 28, 2007 (JP) .................................. 2007-141005

(51) Int. Cl.
*H05K 1/16* (2006.01)
(52) U.S. Cl. ........ 174/260; 174/262; 361/792; 361/794; 361/795; 361/767
(58) Field of Classification Search .................. 174/262, 174/260; 361/792, 794, 795, 767, 788
See application file for complete search history.

(56) References Cited

U.S. PATENT DOCUMENTS

| 5,110,664 | A | 5/1992 | Nakanishi et al. | 428/195 |
| 7,435,912 | B1* | 10/2008 | Alexander et al. | 174/262 |
| 7,484,293 | B2 | 2/2009 | Yamaji et al. | 29/840 |
| 2004/0160721 | A1* | 8/2004 | Barr et al. | 361/104 |
| 2006/0060380 | A1* | 3/2006 | Meyer et al. | 174/262 |

FOREIGN PATENT DOCUMENTS

| JP | 3-41757 | 2/1991 |
| JP | 5-63076 | 8/1993 |
| JP | 6-13181 | 2/1994 |
| JP | 7-202359 | 8/1995 |
| JP | 7-221510 | 8/1995 |
| JP | 2005-236064 | 9/2005 |
| JP | 2005-243864 | 9/2005 |
| JP | 2006-049645 | 2/2006 |
| JP | 2007-180384 | 7/2007 |

OTHER PUBLICATIONS

Japanese Office Action dated Nov. 22, 2011 corresponding to the counterpart Japanese Patent Application No. 2007-141005.

* cited by examiner

*Primary Examiner* — Yuriy Semenenko
*Assistant Examiner* — Andargie M Aychillhum
(74) *Attorney, Agent, or Firm* — Kratz, Quintos & Hanson, LLP

(57) ABSTRACT

A buildup board includes a buildup layer having a multilayer structure and/or a core layer having a multilayer structure. The multilayer structure includes a signal wiring pattern, a pad connected to the signal wiring pattern, an insulating part arranged around the pad on the same layer as the pad, and a conductor arranged around the insulating part on the same layer as the pad. The multilayer structure has at least two different keepouts where the keepout is defined as a minimum interval between an outline of the pad and the conductor closest to the pad on the same layer.

16 Claims, 29 Drawing Sheets

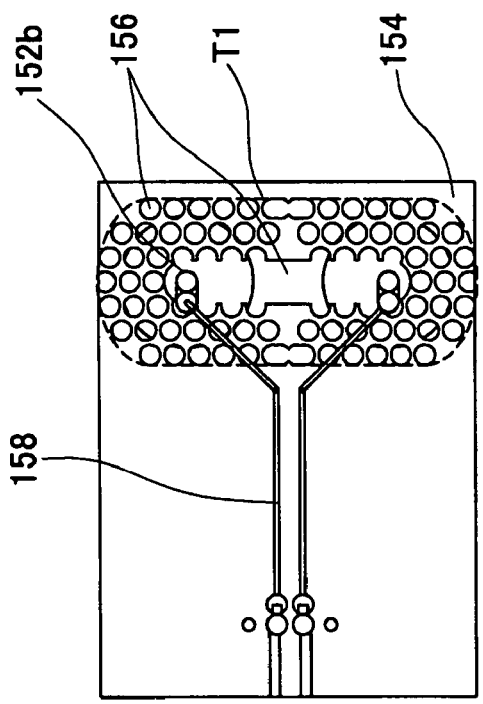
FIG. 8A
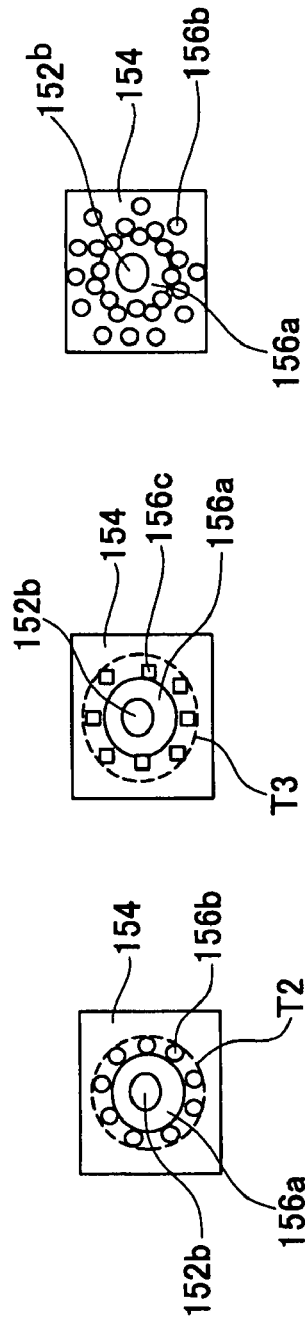
FIG. 8D
FIG. 8C
FIG. 8B

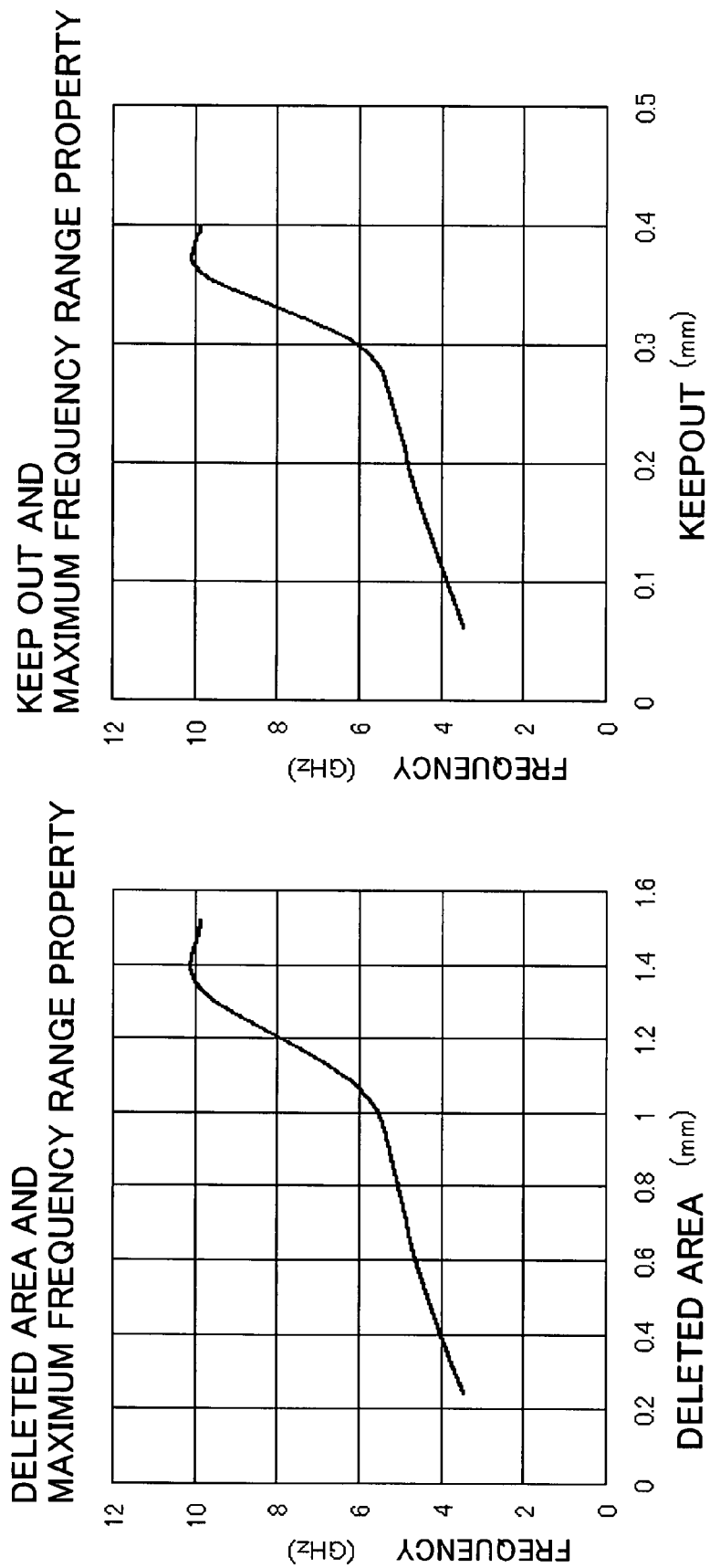

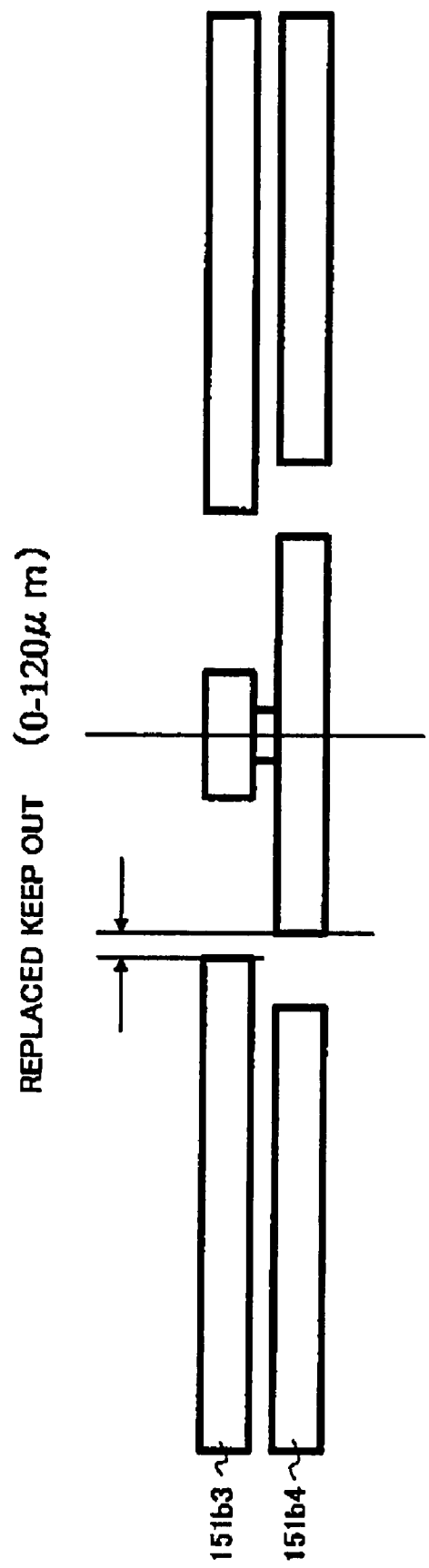

BUILDUP BOARD, AND ELECTRONIC COMPONENT AND APPARATUS HAVING THE BUILDUP BOARD

This application is a CIP application under 35 U.S.C. §120 based on U.S. patent application Ser. No. 11/589,102, filed on Oct. 30, 2006, now abandoned which claims the right of a foreign priority under 35 U.S.C. §119 based on Japanese Patent Applications Nos. 2006-153964, filed on Jun. 1, 2006, and 2007-141005, filed on May 28, 2007, which is hereby incorporated by reference herein in its entirety as if fully set forth herein.

BACKGROUND OF THE INVENTION

The present invention relates to a buildup board. The present invention also relates to an electronic component having a buildup board, such as a package module, e.g., a ball grid array ("BGA") package, and a printed board mounted with the package module, and an electronic apparatus, such as a personal computer ("PC"), a server, a cellular phone, and a digital camera.

A BGA package has conventionally been used to meet a demand for a small and high-performance electronic apparatus. In general, the BGA package is one type of a package module that is mounted with an IC or LSI that serves as a CPU on a package board, and soldered to a printed board (also referred to as a "system board" or "motherboard"). The BGA package can realize the high performance and miniaturization of the electronic apparatus through the high density of the package.

The recent BGA packages often use a buildup board. The buildup board includes a double-sided printed board or multilayer printed board as a core, and adheres a buildup layer to one surface or both surfaces of the core. The buildup layer is an alternate pile of insulating layers and wiring layers, and has a via hole as a plated throughhole for an interfacial connection. The double-sided adhesions can balance the warp. The next generation BGA package is expected to have a higher transmission characteristic. Prior art suggest various methods for improving the transmission characteristic by thinning the core layer, by reducing a specific via hole diameter, or by modifying a physical property value.

The prior art include, for example, Japanese Utility-Model Applications, Publication Nos. 5-63076 and 6-13181, and Japanese Patent Applications, Publication Nos. 7-202359, 7-221510, and 2005-236064.

However, thinning of the core layer has a limit of the strength. In addition, a shape balance among plural via holes also influences the transmission characteristic, and thus a reduction of the specific via hole diameter is also subject to the restriction. Moreover, a change of the physical property value associates with changes of base materials of the core layer and the buildup layer to a low melting point material and a low loss material, but it is difficult to develop a base material that dramatically changes the conventional low melting point material and low loss material. From these restrictions, the prior art methods cannot significantly improve the transmission characteristic. In addition, the prior art methods significantly change the manufacturing method of the multilayer substrate, and problematically increase the cost.

BRIEF SUMMARY OF THE INVENTION

The present invention is directed to a buildup board that can comparatively easily improve a transmission characteristic, an electronic component and an electronic apparatus having the buildup board.

A buildup board according to one aspect of the present invention includes a buildup layer having a multilayer structure and/or a core layer having a multilayer structure, the multilayer structure including a signal wiring pattern, a pad connected to the signal wiring pattern, an insulating part arranged around the pad on the same layer as the pad, and a conductor arranged around the insulating part on the same layer as the pad, wherein the multilayer structure has at least two different keepouts where the keepout is defined as a minimum interval between an outline of the pad and the conductor closest to the pad on the same layer. The multilayer structure of the conventional buildup board has the same minimum keepout determined by the manufacturing capability due to the manufacturing yield and the high density mounting. On the other hand, the instant inventors have discovered that an increased keepout improves a signal transmission characteristic, and thus the buildup board includes a keepout greater than the conventional keepout.

The "buildup layer having a multilayer structure" allows a core layer to have multiple layers, a core layer to have a single layer, and a core layer to be eliminated (i.e., coreless). The "core layer having a multilayer structure" requires that there is a core layer and the core layer has a multilayer structure, allowing that a buildup layer to have a multilayer structure. For both the "buildup layer having a multilayer structure" and the "core layer having a multilayer structure," the multilayer structure for which one or more keepouts are adjusted or compared should belong to the same layer. For example, when both the core layer and the buildup layer have multilayer structures, one keepout of one layer in the buildup layer is not compared with one keepout of one layer in the core layer. In addition, even when a pair of buildup layers are provided to both sides of the core layer, one keepout of one layer in one buildup layer is not compared with one keepout of one layer in the other buildup layer.

The keepout may be different between at least two layers in the multilayer structure or between at least two points on the same layer. When the keepout is different between two layers, the signal transmission characteristic improves using that channel. In addition, when the keepout is different between two points on the same layer, two types of channels can be formed for the high-speed transmissions and the usual transmissions. In that case, the multilayer structure includes a first channel used to transmit a higher frequency signal, and a second channel used to transmit a lower frequency signal than the first channel, the first channel having a keepout larger than that of the second channel.

When the insulating part has plural micro hole parts, the keepout may be determined based on a minimum distance between the outline of the pad and an outline of the plural micro hole parts, and the area of the insulating part. An adjustment based on the area provides an effective keepout based on a ratio of the actual insulating part within the outline of the plural micro hole parts.

The multilayer structure may include a first conductive layer closest to an external printed board, and a second conductive layer closest to the first conductive layer, and the keepout of the second conductive layer is preferably larger than that of the first conductive layer. According to the simulation result conducted by the instant inventors, the transmission characteristic of the buildup board improves in a range between −6 dB and −36 dB. A value smaller than "−36 dB" cannot meet the high density demand. A value greater than "−6 dB" cannot meet the transmission characteristic demand.

As shown in FIG. 27, the replaced keepout falls preferably between 0 and 120 μm, and more preferably 80 μm when the pad of the second conductive layer L9 is replaced with the pad of the first conductive layer L10. According to the simulation result conducted by the instant inventors, the transmission characteristic of the buildup board improves in that range. The multilayer structure further includes a third conductive layer closest to an external printed board at an opposite side of the first conductive layer with respect to the second conductive layer, and wherein the keepout of the third conductive layer is equal to or smaller than that of the second conductive layer. According to the simulation result conducted by the instant inventors, the transmission characteristic of the buildup board improves in a range.

The multilayer structure has a pad-cum conductive layer having the pad, and a pad-free conductive layer having the insulating layer and no pad at a position corresponding to the pad of the pad-cum conductive layer. The pad-free conductive layer can improve the transmission characteristic.

An electronic component that includes the buildup board, and an electronic apparatus which includes the electronic component also constitute another aspect of the present invention. The electronic component may include a BGA package.

A method for manufacturing a buildup board according to another aspect of the present invention that includes a buildup layer having a multilayer structure and/or a core layer having a multilayer structure, the multilayer structure including a signal wiring pattern, a pad connected to the signal wiring pattern, an insulating part arranged around the pad on the same layer as the pad, and a conductor arranged around the insulating part on the same layer as the pad includes the step of forming the pad, the conductor, and the insulating part so that the multilayer structure has at least two different keepouts where the keepout is defined as a minimum interval between an outline of the pad and the conductor closest to the pad on the same layer. The multilayer structure of the conventional buildup board has the same minimum keepout determined by the manufacturing capability due to the manufacturing yield and the high density mounting. On the other hand, the instant inventors have discovered that an increased keepout improves a signal transmission characteristic, and thus the buildup board includes a keepout greater than the conventional keepout to improve the transmission characteristic. A computer-implemented program that is used to calculate the keepout also constitutes one aspect of the present invention. More specifically, the forming step includes the steps of setting a light shielding shape of a mask or a laser irradiation area for direct drawing, and exposing each layer in the multilayer structure based on the light shielding shape of a mask or the laser irradiation area for direct drawing set by the setting step. This manufacturing method can manufacture the above buildup board using the conventional manufacturing machine structure.

The forming step may form two different signal transmission channels in the multilayer structure, and makes the keepout different between at least two points on the same layer so that a larger keepout is set to one of the two different signal transmission channels, which one is used for higher frequency signal transmissions than the other.

Other objects and further features of the present invention will become readily apparent from the following description of preferred embodiments with reference to the accompanying drawings.

BRIEF DESCRIPTION OF THE DRAWINGS

FIGS. 8A to 8D are plane views showing various arrangements of the insulating part around the pad.

FIG. 9A is a graph showing a relationship between the area of the insulating part in a second conductive layer (which is the second lowest layer in FIG. 4) and the frequency. FIG. 9B is a graph showing a relationship between a keepout of the second conductive layer (which is the second lowest layer in FIG. 4) and the frequency.

FIG. 27 is a partially enlarged sectional view of a package board when the second conductive layer (that is second lowest) from the bottom in FIG. 4 is replaced with the first or lowest conductive layer from the bottom in FIG. 4.

DETAILED DESCRIPTION OF THE PREFERRED EMBODIMENTS

Figure 1:
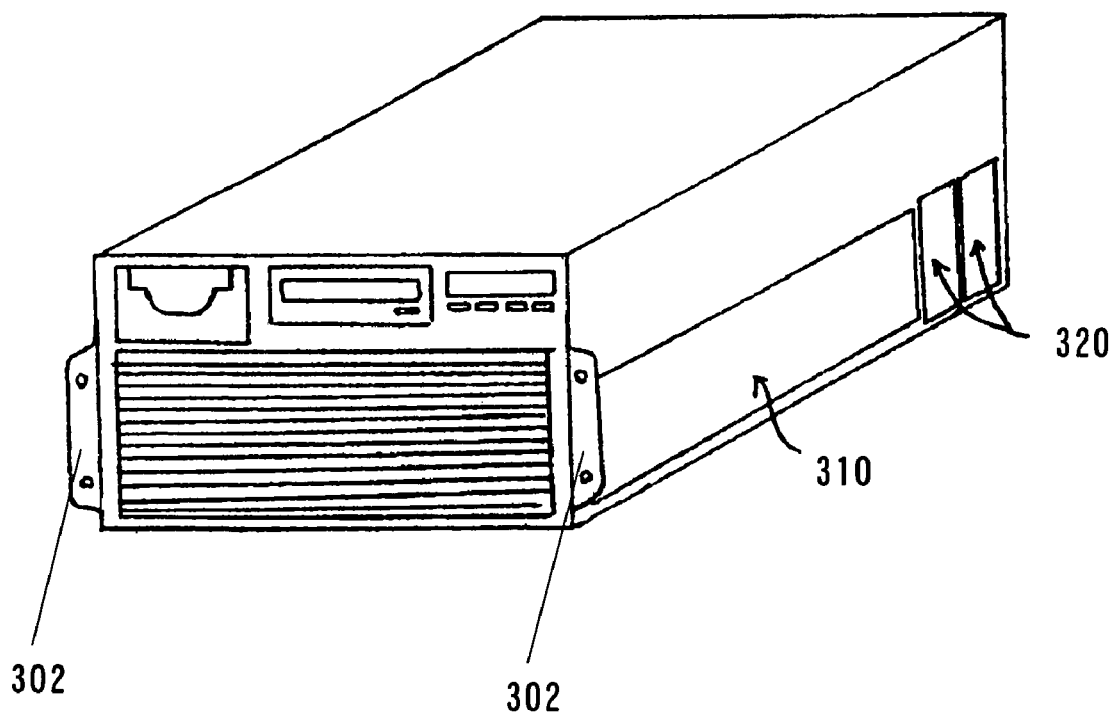
FIG. 1 is a schematic perspective view of a server (electronic apparatus) according to one aspect of the present invention.
Figure 2:
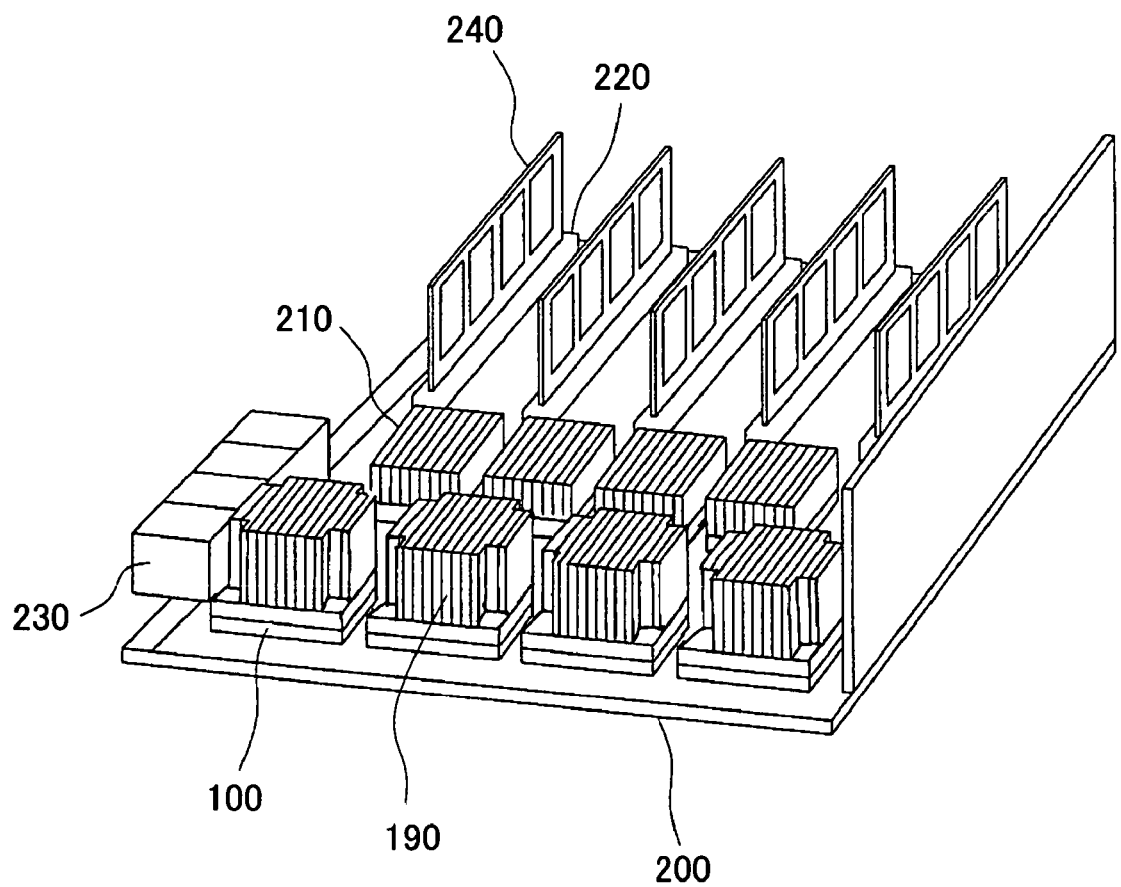
FIG. 2 is a schematic perspective view of a printed board installed into the server shown in FIG. 1.
Figure 3:
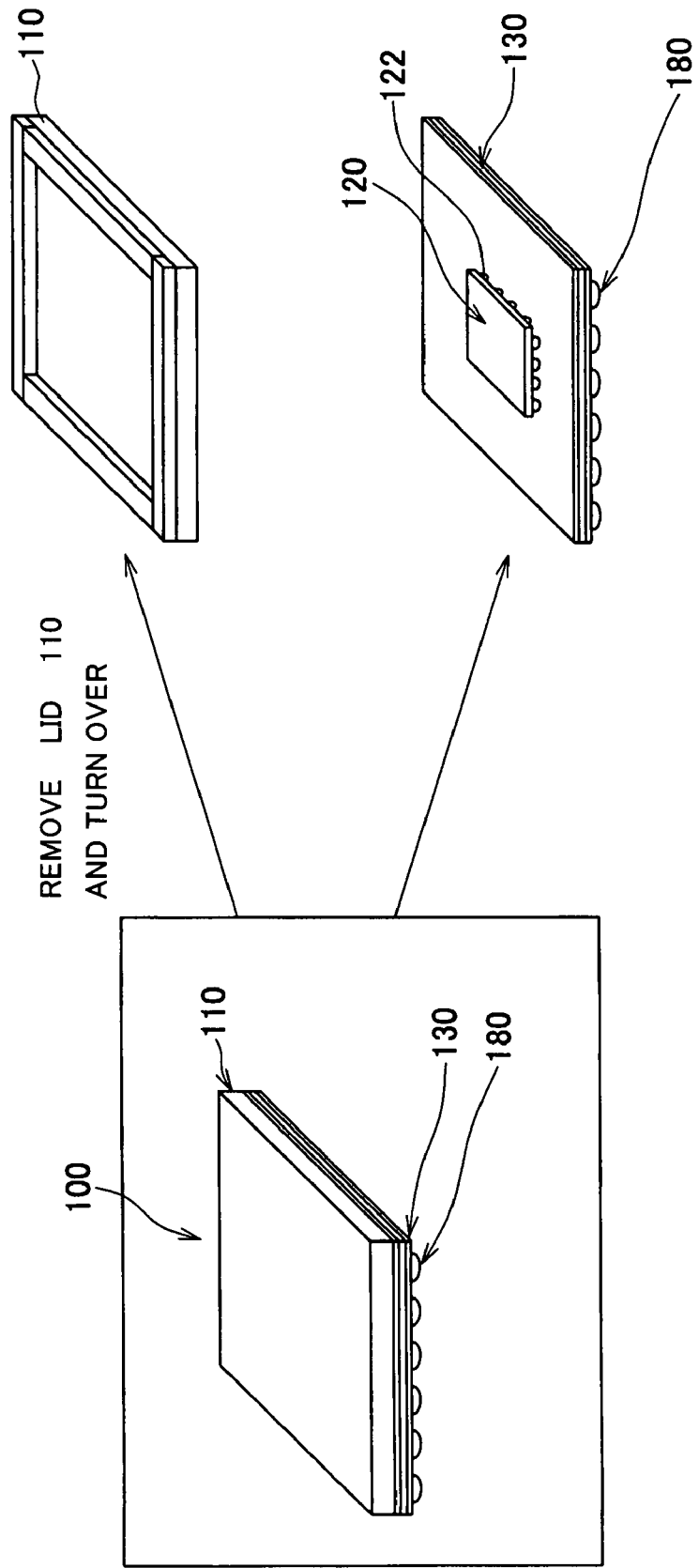
FIG. 3A is a schematic perspective view of a package module mounted on the printed board 100 shown in FIG. 2.
FIG. 3B is an exploded perspective view of the package module 100 shown in FIG. 3A.

Referring now to the accompanying drawings, a description will be given of a buildup board according to one aspect of the present invention, a package module 100 having the multilayer substrate, a printed circuit board 200 mounted with the package module 100, and a server (electronic apparatus) 300 that includes the printed circuit board 200. This application defines the package module 100 and the printed board 200 as one embodiment of the electronic component. Here, FIG. 1 is a schematic perspective view of the server 300. FIG. 2 is a perspective overview of the printed circuit board 200. FIG. 3A is a perspective overview of the package module 100. FIG. 3B is an exploded perspective view of the package module 100 shown in FIG. 3A.

As shown in FIG. 1, the electronic apparatus of this embodiment is exemplarily implemented as a rack mount type UNIX server, but may be a PC, a personal digital assistant ("PDA"), a cellular phone, a digital camera, a tester, or another electronic apparatus. The electronic apparatus 300 is screwed onto a rack (not shown) by a pair of attachment parts 302, and includes the printed circuit board 200 shown in FIG. 2 in a housing 310.

The housing 310 is provided with a fan module 320, which rotates a built-in cooling fan to generate the airflow and compulsorily cools a heat sink 190, which will be described later.

As shown in FIG. 2, the printed circuit board 200 includes the package module 100, an LSI module 210 around the package module 100, a plurality of block plates 220 for receiving a plurality of memory cards 240, and a connector 230 for an external device, such as a hard disc drive ("HDD") and a LAN.

The package module 100 serves as a BGA module, but the present invention does not prevent another package module, such as a land grid array ("LGA"), from being applied to the package module 100.

The package module 100 includes, as shown in FIGS. 3A and 3B, a lid 110, a semiconductor chip 120, a package board 130, and plural BGA balls 180.

The lid 110 is joined with the package board 130, and seals the semiconductor chip 120. Apparently, the lid 110 has a square pillar shape with a square end or top surface when viewed from the top, but the lid 110 has a concave section with a caved center part. The lid 110 serves as a heat spreader joined with the heat sink 190.

The lid 110 is arranged between the package board 130 and the heat sink 190, and connected to the semiconductor chip 120 via a jointing member (not shown). The lid 110 as the heat spreader serves to transmit the heat from the semiconductor chip 120 to the heat sink 190. Another embodiment omits the lid 110 and directly joins the heat sink 190 with the top of the semiconductor chip 120.

The semiconductor chip 120 is an exothermic circuit element, and is soldered onto the package board 130 via bumps 122 as terminals. Resin underfill that is usually used for a flip chip (which is a chip that has bumps) fills between the semiconductor chip 120 and the package board 130, seals the bumps 122, and maintains the connection reliability of the bumps 122.

The package board 130 is mounted with the semiconductor chip 120 that serves as a CPU on its top surface and another circuit element (not shown), such as a capacitor, and the BGA balls 180 on its bottom surface. The package board 130 of this embodiment is a single chip type that mounts only one semiconductor chip 120, but the present invention is applicable to a multi-chip type.

Figure 4:
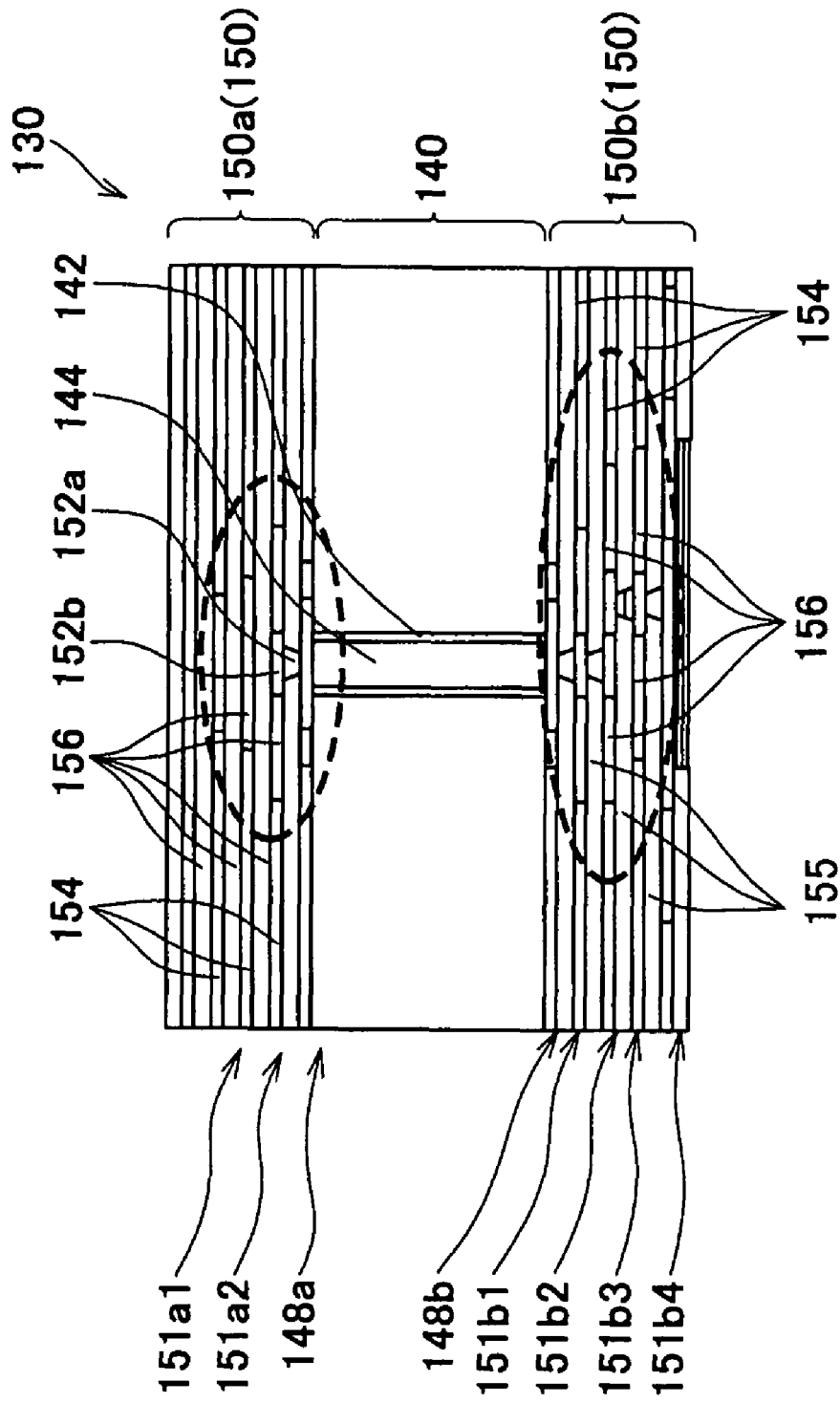
FIG. 4 is a partially enlarged sectional view of a package board in the package module shown in FIGS. 3A and 3B.

The package board 130 of this embodiment is made of a buildup board. FIG. 4 is a partially enlarged sectional view of the package board 130. The package board 130 includes a core layer (or "core substrate") 140 that serves as a printed board, and multilayer buildup layers 150a and 150b at both sides (i.e., front and back sides) of the core layer 140. Reference numeral 150 generalizes 150a and 150b.

In this embodiment, at least one of the core layer 140 and the buildup layer 150 has a multilayer structure. For example, the core layer 140 may have a multilayer structure and the buildup layer 150 may not have a multilayer structure. The core layer 140 may have no multilayer structure and the buildup layer 150 may have a multilayer structure. Both the core layer 140 and the buildup layer 150 may have multilayer structures. As described layer, when there is no core layer 140 (or in case of a coreless structure), only the buildup layer 150 has a multilayer structure. Only one of the buildup layers 150a and 150b may have a multilayer structure.

The multilayer structure includes a signal wiring pattern, a pad connected to the signal wiring pattern, an insulating part arranged around the pad on the same layer as the pad, and a conductor arranged around the insulating part on the same layer as the pad.

Figure 26:
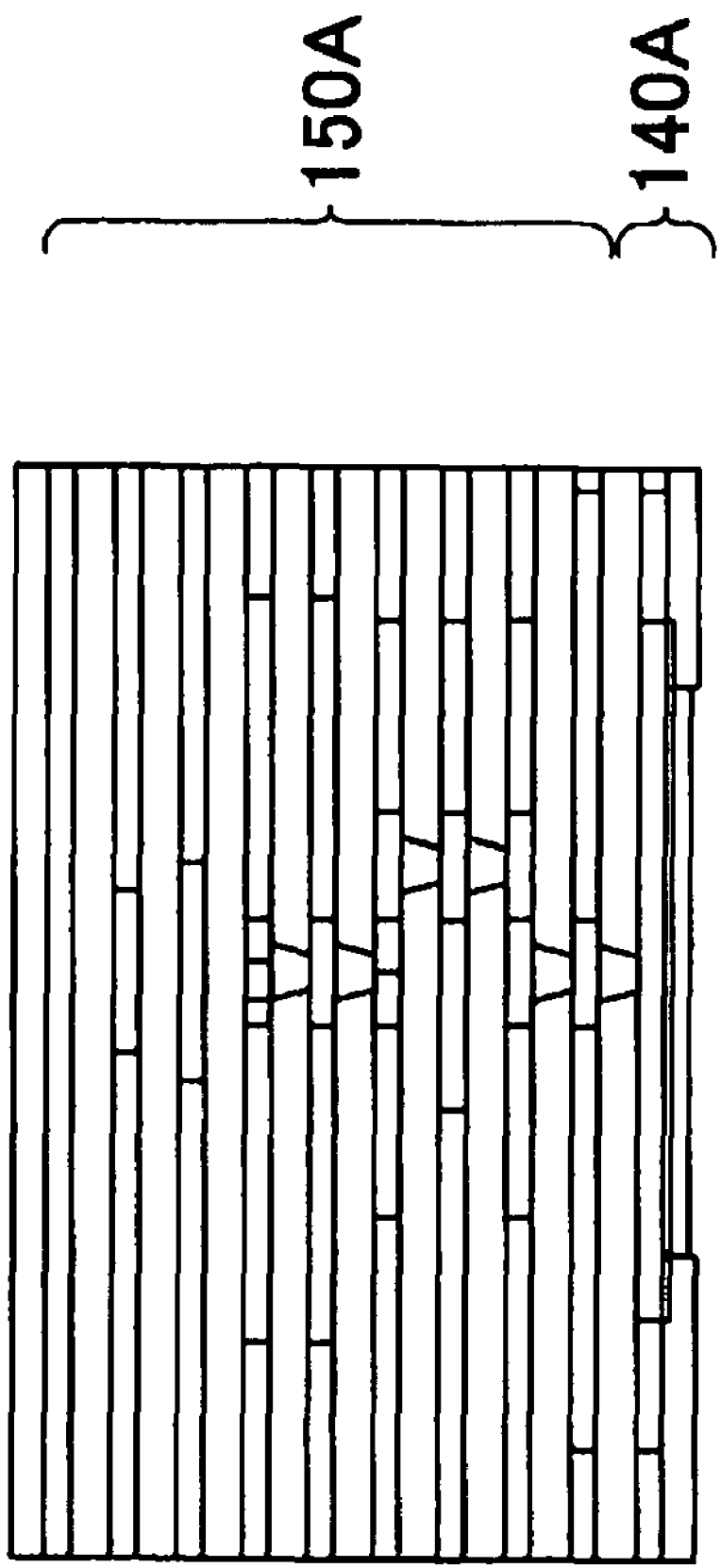
FIG. 26 is a schematic sectional view showing an illustrative coreless buildup board.

The core layer 140 has a through-hole via (or via hole) 142 that perforates the core layer 140 in its thickness direction, and the through-hole via 142 electrically connects the buildup layers 150a and 150b at the both sides. A base of the core layer 140 is made of an insulation. In another embodiment, the package board 130 has no core layer 140 (coreless). FIG. 26 illustrates a coreless buildup board that includes a base layer 140A and a buildup layer 150A. In still another embodiment, the core layer 140 has a multilayer structure that is a layered structure that alternately stacks a conductive layer and an insulating layer.

The core layer 140 has conductive layers 148a and 148b on the front and back sides. The conductive layer 148a is formed on the side of the buildup layer 150a of the core layer 140, and the conductive layer 148b is formed on the side of the buildup layer 150b of the core layer 140.

Figure 5A:
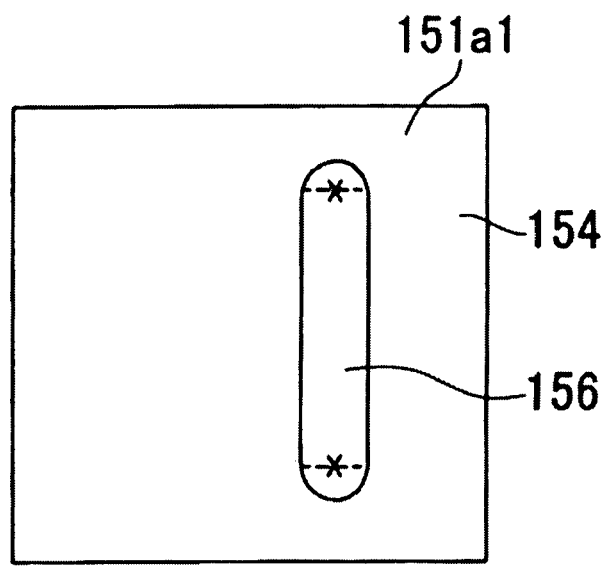
FIGS. 5A to 5H are partially enlarged plane view of an insulating part around a pad in conductive layers in the package board shown in FIG. 4.
Figure 5B:
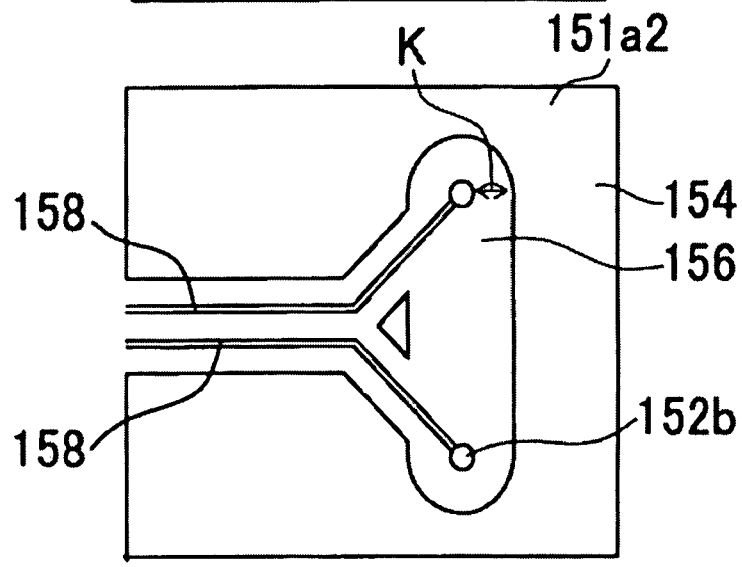
Figure 5C:
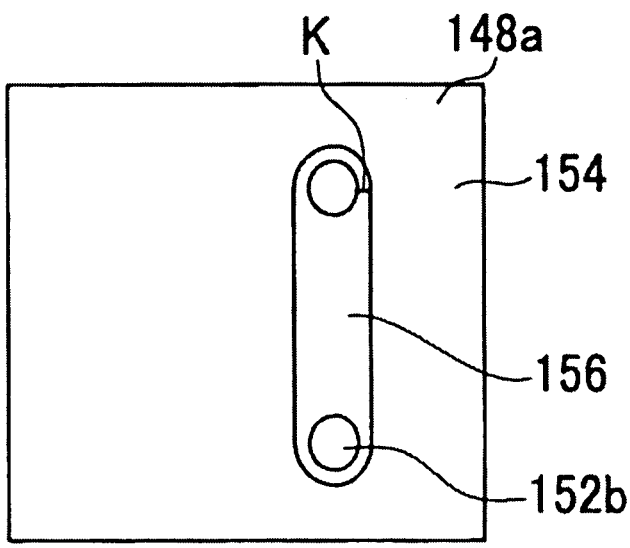

The buildup layer 150 has plural insulating layers 155, insulating parts 156, and plural wiring parts. FIG. 4 omits the signal wiring pattern 158 but FIG. 5B shows it. The insulating layer 155 and the insulating part 156 are made of the same material.

The conductive part of the buildup layer 150 nearest the core layer 140 is connected to the conductive layer formed on the front and back surfaces of the core layer 140. The buildup layer 150 has a power source layer and a ground layer (collectively referred to as a "conductive layer" that does not distinguish them). The conductor 154 in the conductive layer is made of a copper foil (plating).

The buildup layer 150 has a layered structure, and may or may not have a core in it. The buildup layer 150 has a via hole 152a and provides an interfacial connection when a laser-made hole between adjacent specified layers is copper-plated on its wall surface. The copper plating fills the via hole 152a of this embodiment, thereby making, as in the buildup layer 150b, perpendicular stack via holes, and increasing the density. However, it is optional to fill plating in the via hole 152a.

The buildup layer 150 alternately piles plural conductive layers ($151a_1$, $151b_1$, etc.) and the insulating layers 155. In general, each conductive layer is provided with the signal wiring pattern 158. The via hole 152a has a trapezoidal section in FIG. 4, and its three-dimensional shape is a truncated cone. In FIG. 4, a rectangular section integrally connected to the via hole 152a is a (signal) pad 152b, and its three-dimensional shape is a disc shape. The via hole 152a and the pad 152b electrically connect plural conductive layers. The pad 152b is arranged in a corresponding conductive layer by one-by-one correspondence in this embodiment, and connected to the signal wiring pattern 158. The insulating part 156 is arranged around the pad 152b, and the conductor 154 is provided around the insulating part 156.

The package board 130 has keepouts that are different at least at two points in the multilayer structure. The keepout is defined as a minimum distance of the insulating part 156 between the outline and the pad 152b and the conductor 154 closest to that pad 152b on the same layer.

A description will now be given of an embodiment that adjusts keepouts in the core layer 140 that has a multilayer structure, and keepouts in the buildup layer 150 that has a multilayer structure. The multilayer structure for which one or more keepouts are adjusted or compared should belong to the same layer. When both the core layer 140 and the buildup layer 150 have multilayer structures, one keepout of one layer in the buildup layer is not compared with one keepout of one layer in the core layer. In addition, even when a pair of buildup layers are provided to both sides of the core layer, one keepout of one layer in the upper buildup layer is not compared with one keepout of one layer in the lower buildup layer.

The keepout may differ between at least two layers in the multilayer structure, or between at least two points on the same layer. A description will now be given of the former example. For example, a keepout of at least one layer may be adjusted larger than the conventional keepout. The "at least one layer" intends to mean that keepouts of all or part the conductive layers in the package board 130 may be adjusted.

This embodiment adjusts keepouts of both the core layer 140 and the buildup layer 150. Therefore, the keepouts are different at least two points in the multilayer structure of the core layer 140. More specifically, the conductive layers 148a and 148b formed on the front and rear surfaces of the core layer 140 have different keepouts. The keepouts are different at least two points in the multilayer structure of the upper buildup layer 150a. More specifically, the conductive layers $151a_1$, and $151a_2$ formed in the upper buildup layer 150a have different keepouts. Moreover, the keepouts are different at least two points in the multilayer structure of the lower buildup layer 150b. More specifically, the conductive layers $151b_1$, to $151b_4$ formed in the lower buildup layer 150b have different keepouts. Thus, in this embodiment, keepouts of all the conductive layers in the package board 130 are objects to be adjusted.

In another embodiment, the "at least one layer" covers the conductive layers $151a_1$, and $151a_2$ in the upper buildup layer 150a, and the conductive layers $151b_1$, to $151b_4$ in the lower buildup layer 150b, but does not cover the conductive layers 148a and 148b formed on the front and back surfaces of the core layer 140. In still another embodiment, the "at least one layer" covers only the conductive layers $151b_1$, to $151b_4$ in the lower buildup layer 150b. Moreover, some layers that exclude a specific layer may be adjusted. For example, in adjusting the buildup layer 150b, only the conductive layers $151b_1$, to $151b_3$ are adjusted and the conductive layer $151b_4$ that is connected to the printed board 200 via the BGA balls 180 is removed from the object to be adjusted.

Figure 11:
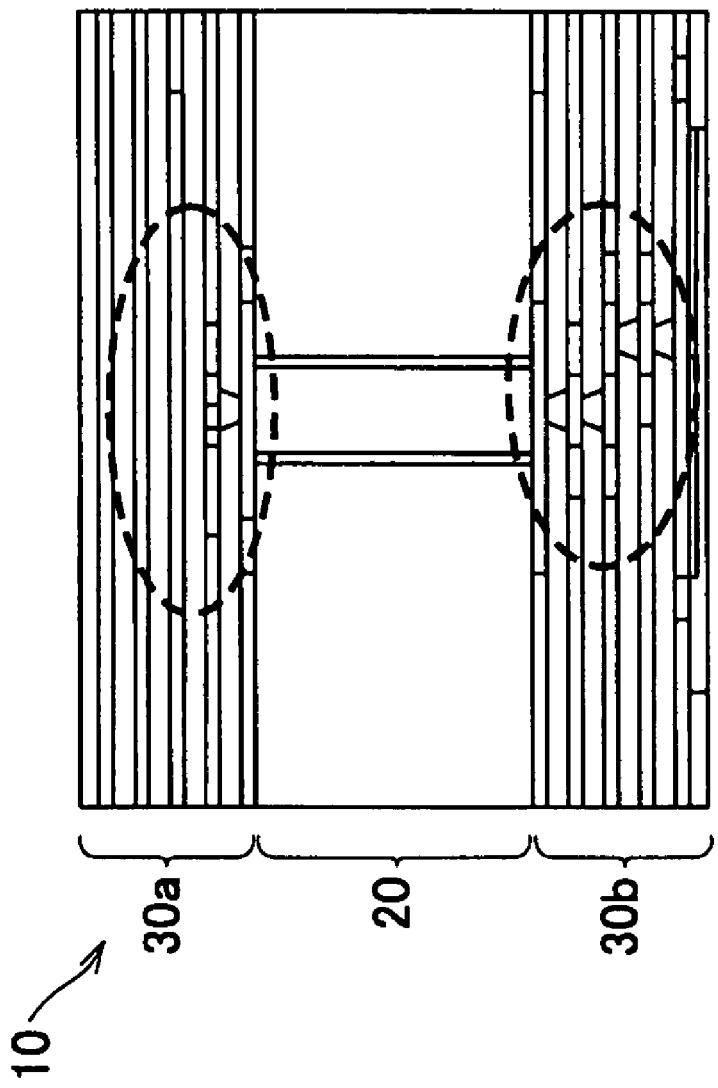
FIG. 11 is a partially enlarged sectional view of a conventional package board.

The package board 130 improves the transmission characteristic by adjusting the keepout that has been constant in conventional conductive layers as shown in FIG. 11. The multilayer structure in each of the buildup layers 30a and 30b in the package board 10 has the same keepout determined by the manufacturing capability due to the manufacturing yield and the high density. Here, FIG. 11 corresponds to FIG. 4, and is a schematic sectional view of a conventional buildup board 10. The package board 10 includes a core layer 20, and a pair of buildup boards 30a and 30b. When dotted line part is addressed, the keepout is constant around each pad. The simulation used as the physical values of the buildup layer a dielectric constant of 3.4 and a relative permeability of 1.

The instant inventors have discovered that an increased keepout improves a signal transmission characteristic, and thus the buildup layer 150 has a keepout larger than the conventional keepout.

Figure 6:
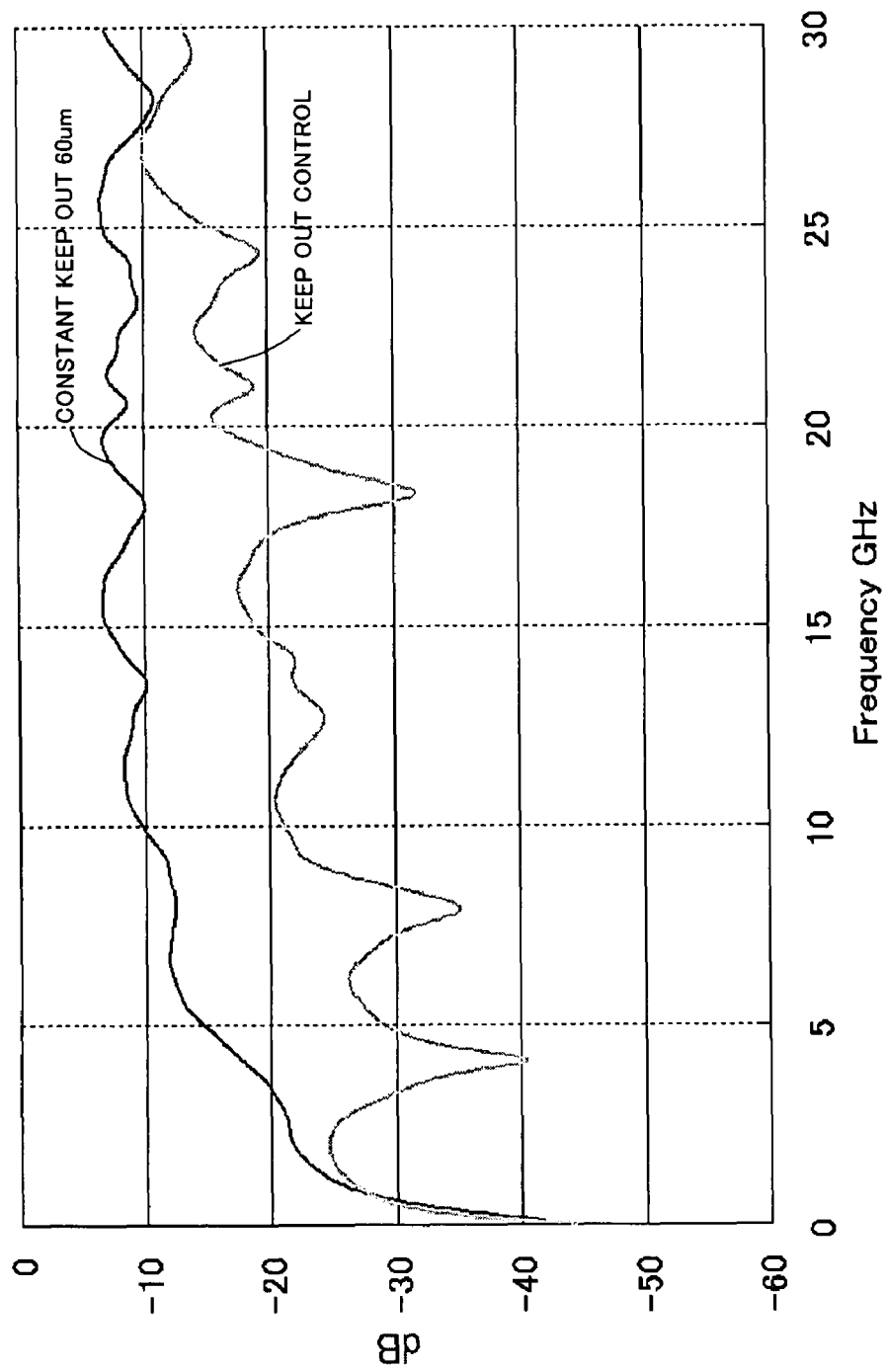
FIG. 6 is a graph for explaining an improvement of the transmission characteristic of the package board shown in FIG. 4.

FIG. 6 is a graph that compares the transmission characteristic of the conductive layer in which the keepout is adjusted in the conductive layers shown in FIG. 4 with that of the conventional conductive layer shown in FIG. 11 having a constant keepout. In FIG. 6, the abscissa axis denotes a frequency (GHz), and the ordinate axis denotes a frequency loss (dB). FIG. 6 indicates that a low frequency suffers a small loss. The structure shown in FIG. 4 is better than that shown in FIG. 11 by about twice to four times with respect to frequency band between −6 dB and −36 dB. This simulation is calculated with physical values of the currently available materials, and would vary with new materials that are available in the future.

The manufacturing method of the package board 130 of this embodiment includes the step of making different the keepout at least at two points in the plural conductive layers. The adjustment or optimization, for example, first prepares a database that collects many results of the transmission characteristics by varying keepouts in the conductive layers in a multilayer substrate that includes a specific signal wiring pattern 158 and a layered structure. Next, an optimal value of a keepout is obtained for each conductive layer which provides the optimal transmission characteristic for the specific signal wiring pattern 158 and the layered structure. For another signal wiring pattern 158 and another layered structure, a keepout may be simulated with the database made for the other signal wiring pattern 158 and layered structure, or by conducting another experiment for the other signal wiring pattern 158 and layered structure. The keepout optimization in the manufacturing method of this embodiment can be implemented as a program.

The manufacturing method of the package board 130 of another embodiment includes the step of adjusting the area of the insulating part 156 around the pad 152b at least at two points among the plural conductive layers. Conventionally, the areas of the insulating parts 156 around the pads 152b are maintained constant when the pad 152b has the same area, but this embodiment varies the area of the insulating part 156. In addition, in the conventional structure, when the areas of the pads 152b differ between two layers, the areas of the insulating parts 156 are in proportion to the area ratio between the pads 152b but this embodiment modifies this scheme.

Moreover, the manufacturing method of this embodiment may further include the step of adjusting a keepout and the area of the insulating part 156 in the conductive layer $151a_1$ having no pad 152b shown in FIG. 4. Here, the "conductive layer having no pad 152b" is adjacent to a conductive layer having a pad via the insulating layer, and a conductive layer that has no pad at a position corresponding to the pad in the adjacent conductive layer having the pad. For example, the conductive layer $151a_1$ is adjacent via the insulating layer 156 to the conductive layer $151a_2$ having the pad 152b, and has no pad at a position corresponding to the pad 152b of the conductive layer $151a_2$ (see FIGS. 4 and 5A).

Thus, the transmission characteristic is effectively improved by adjusting the insulating part in the conductive layer that has no pad. In adjusting the insulating part in the conductive layer that has no pad, a keepout of the conductive layer that has no pad will be first defined. This embodiment defines the "keepout of the conductive layer that has no pad" as a keepout if the conductive layer that has no pad is provided with a pad of the adjacent conductive layer having the pad. For example, the keepout of the conductive layer $151a_1$ can be obtained by virtually forming the pad 152b of the conductive layer $151a_2$ shown in FIG. 5B in the insulating part 156 shown in FIG. 5A so that a center of each pad 152b of the conductive layer $151a_2$ accords with a center of the upper and lower semicircles in the insulating part 156 shown in FIG. 5A. FIG. 5A shows the upper and lower semicircles by a dotted line, and the centers of them are denoted by "x." In the core layer 140, a virtually formed pad for a conductive layer that has no pad is a pad of the through-hole via 142.

The area of the insulating layer 156 around the pad in the conductive layer $151a_1$ that has no pad 152b is defined as the area of the insulating layer 156 shown in FIG. 5A from which the area of the virtually formed pad 152b is removed in the conductive layer $151a_1$, as described above.

Turning back to FIG. 4, consider two conductive layers $151a_1$ and $151b_1$ in the upper buildup layer 150a, and the upper conductive layer 148a and the lower conductive layer 148b in the core layer 140, and the four conductive layers $151b_1$ to $151b_4$ in the lower buildup layer 150b. This embodiment will be able to refer to these conductive layers L3 layer to L10 layer in this order. FIGS. 5A to 5H show the insulating parts 156 around the pads 152b in each conductive layer, although there is no pad 152b in FIG. 5A. In FIGS. 5B to 5H, "k" denotes a keepout. In FIGS. 5A to 5H, a white part denotes the insulating part 156. The keepout k is a minimum distance between the outline of the pad 152b and the conductor 154.

The instant inventors have discovered that the keepout of the conductive layer $151b_3$ or the area of the insulating part 156 around the pad in the conductive layer $151b_3$ is the most important in the package board 130 of this embodiment, and an adjustment of only the keepout and/or the area of the insulating part 156 in the conductive layer $151b_3$ would remarkably improve the transmission characteristic.

In addition, the instant inventors have discovered that the conductive layer $151b_4$ is influential next to the conductive layer $151b_3$. Therefore, the instant inventors have discovered that adjustments of only the keepout and/or the area of the insulating part 156 in each of the conductive layers $151b_3$ and $151b_4$ would remarkably improve the transmission characteristic. The conductive layer $151b_4$ is the (first) conductive layer that has a pad for the BGA ball 180 nearest the side at which the package board 130 is connected to the printed board 200. The conductive layer $151b_3$ is the (second) conductive layer nearest the conductive layer $151b_4$ and the second closest to the mounting side next to the conductive layer $151b_4$.

Figure 7:
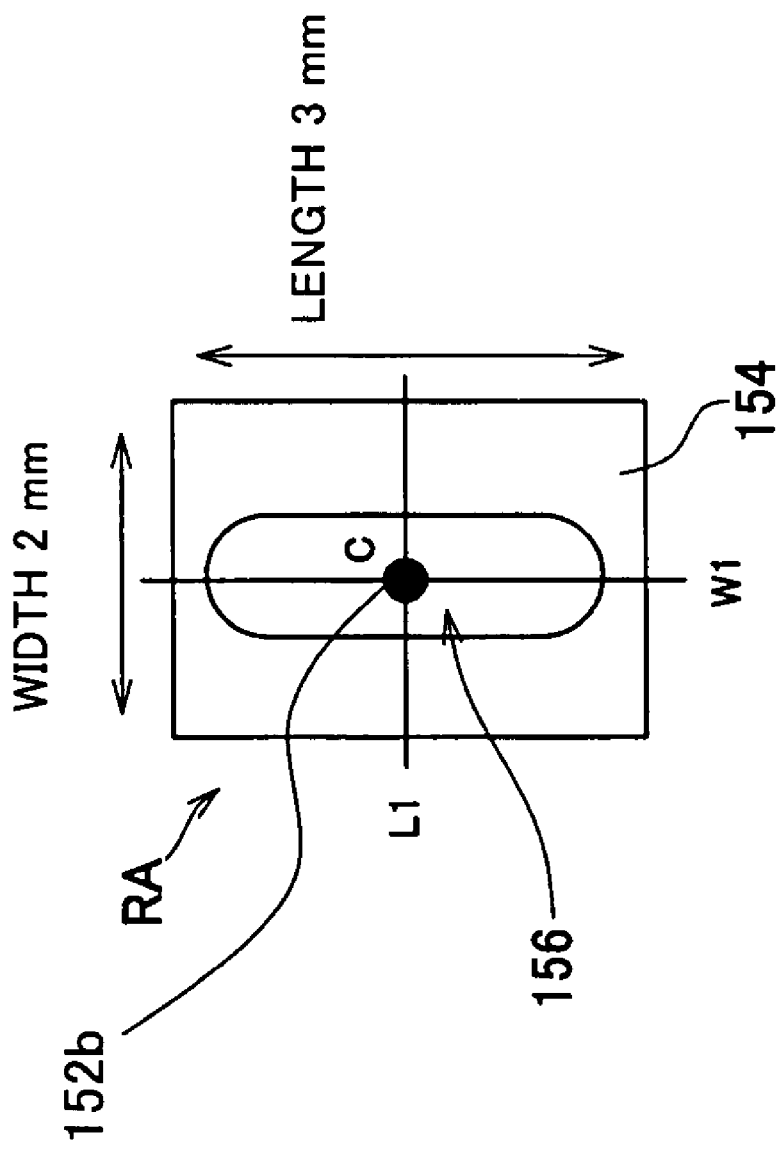
FIG. 7 is a plane view for explaining a target area of the insulating part around the pad.

Referring now to FIGS. 7 to 9B, a description will be given of a relationship among the keepout, the area of the insulating part 156 around the pad 152b, and the conductive layers $151b_3$ and $151b_4$. Here, FIG. 7 is a plane view for explaining a target range of the insulating part 156 around the pad 152b.

Referring to FIG. 7, this embodiment sets a rectangular area RA having a length of 3 mm and a width of 2 mm which includes the pad 152b around the pad 152b. The area of the insulating part 156 in the area of 6 mm² of the rectangular area RA is addressed, although the size of the rectangular area RA shown in FIG. 7 is illustrative. There are a pair of pads 152b in this embodiment, but the number of pads 152b may be one as shown in FIGS. 8A to 8D. Therefore, it is sufficient to consider a square area that has a side of 2 mm or smaller and a center at the center of each pad 152b. Since the pad 152b is a conductor (copper plating), the area of the pad 152b is removed from the area of the insulating part 156.

In setting the square area, an alignment between the insulating part 156 and the rectangular area is necessary and performed as follows. First, a center C as an intersection between lines L1 and W1 is set by drawing the line L1 that halves the length of the rectangular area RA and the line W1 that halves the width of the rectangular area.

The conductive layer $151a_1$, shown in FIG. 5A has no pad 152b but has only the insulating part 156 having a track shape that combines a pair of semicircles with the rectangle. In the alignment shown in FIG. 7, the center of the insulating part 156 is aligned with C, the line that halves the longitudinal direction of the insulating part 156 is aligned with L1, and the line that halves the width direction of the insulating part 156 is aligned with W1.

When the conductive layer has the pad 152b in the insulating part 156 as shown in FIGS. 5C to 5H, such an alignment is conducted that a middle position between the centers of the pair of pads 152 is aligned with the center C, and a center of the pair of pads 152b is arranged on the line W1.

The conductive layer $151a_2$ shown in FIG. 5B arranges the signal wiring pattern 158 via the insulating part 156 on the conductor 154, and is connected to the pad 152b. Even the conductive layers 148a, 148b, $151a_1$, and $151b_1$ to $151b_4$ have a signal wiring pattern 158, but the signal wiring pattern 158 does not appear in FIGS. 5A, 5C to 5H. The insulating part 156 under the signal wiring pattern 158 is combined with the track-shaped insulating part 156 in the conductive layer $151a_2$, and constitutes the insulating part 156 around the pad 152b as long as it is within the area RA shown in FIG. 7.

FIG. 8A is a plane view showing a state that the conductor 154 is punched by multiple circular insulating parts (perforation holes) 156. In this case, an alignment can set an orthogonal coordinate similar to the conductive layer 148b, since the outline $T_1$ of the insulating part 156 shown by a dotted line has a track shape similar to the conductive layer 148b shown in FIG. 5D.

Figure 5D:
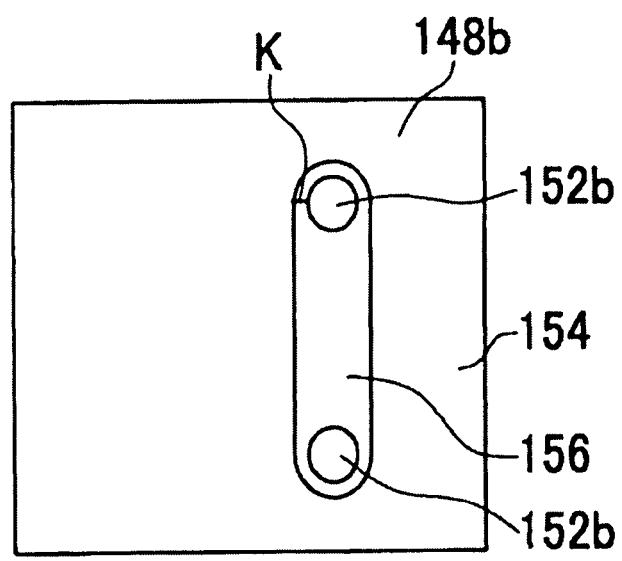
Figure 5E:
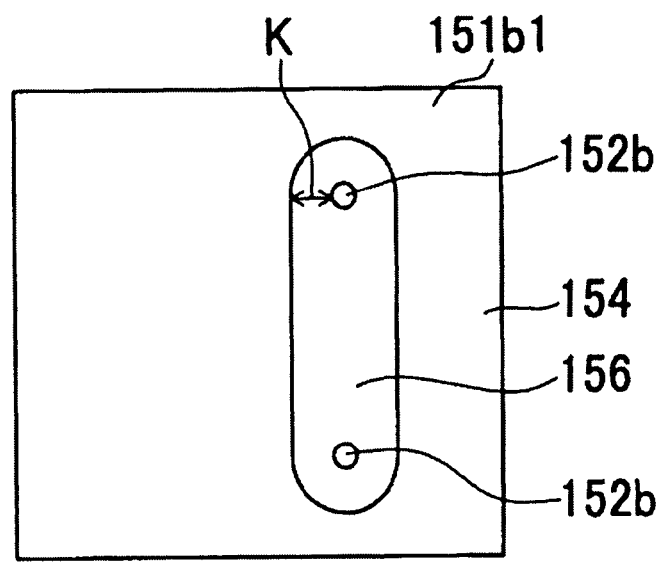
Figure 5F:
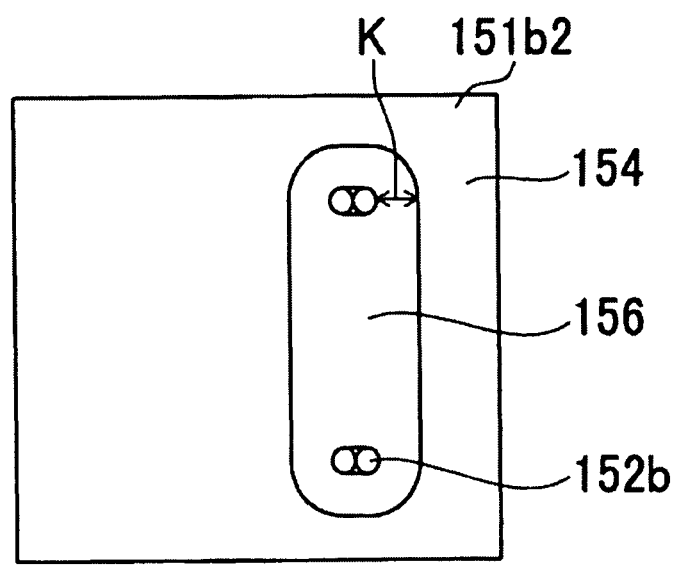
Figure 5G:
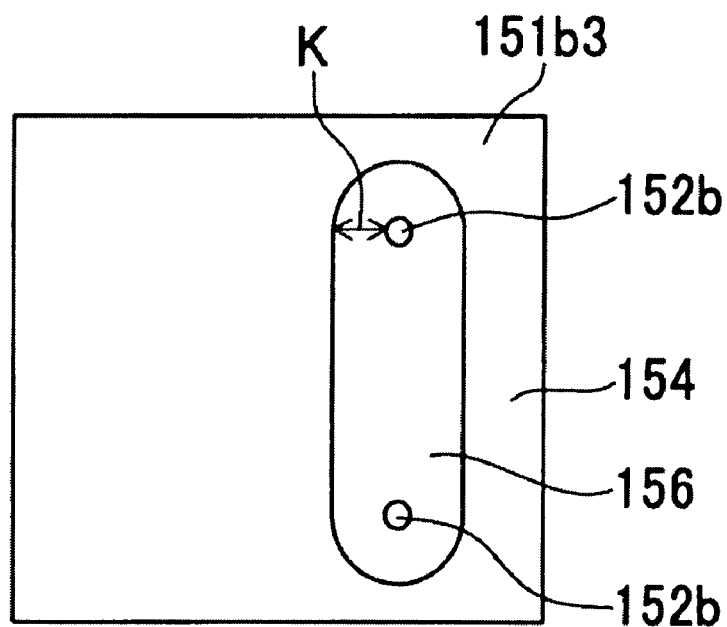
Figure 5H:
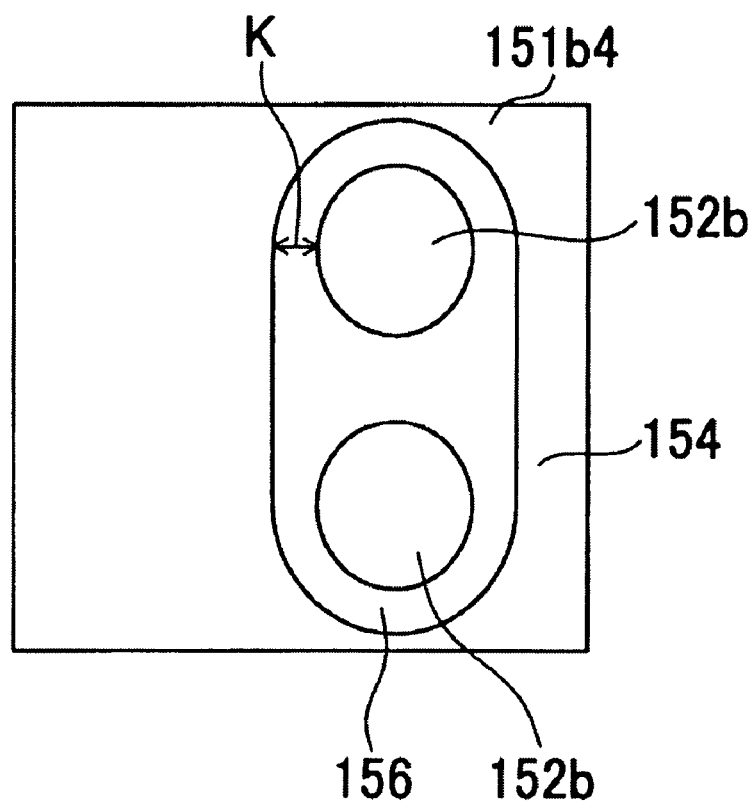

When the insulating part 156 has plural micro hole parts as shown in FIG. 8A, the keepout is calculated as shown in FIG. 5D, smaller when the insulating part 156 is perfectly punched except the pad 152b in the track area. One illustrative calculating method calculates the keepout by considering the area of the insulating part 156 in the outline $T_1$ shown in FIG. 8A (or a ratio of the area of the insulating part 156). For example, if it is assumed that k denotes the keepout when only the insulating part 156 exists without the conductor 154 around the pad 152 in the outline $T_1$ (in the state shown in FIG. 5D), the substantial keepout becomes 0.55 k when the ratio of the area of the insulating part 156 in the outline $T_1$ is 55%. Of course, an operation necessary to calculate the net keepout may be added in addition to a simple multiplication of the ratio of the area of the insulating part 156.

The area of the insulating part 156 around the pad 152b in FIG. 8A is a sum of the areas of the insulating parts 156 having all the micro hole parts and other shapes.

FIG. 8B is a schematic plane view showing the insulating part 156a around the pad 152b is circular and nine circular insulating parts (perforation holes) 156b are: provided around the insulating part 156a. FIG. 8C is a schematic plane view showing the insulating part 156a around the pad 152b is circular and eight square insulating parts (perforation holes) 156c are provided around the insulating part 156a. In FIGS. 8B and 8C, the center of the pad 152b accords with the center of the circular insulating part 156a around the pad 152b, and nine circular insulating parts 156b and the eight square insulating parts 156c are respectively formed at regular intervals from the center of the pad 152b. In other words, a circular outline $T_2$ of each of the nine circular insulating parts 156b and a circular outline $T_3$ of each of the eight square insulating parts 156c accord with the center of the pad 152b. Therefore, the center of the pad 152b accords with the center C, and an orthogonal coordinate can be set in an arbitrary direction.

The keepout when the insulating part 156 is a combination of the insulating part 156 and 156b or 156c, as shown in FIGS. 8B and 8C can be calculated as a sum of a normal keepout in the insulating part 156a and a net keepout in the insulating part 156b or 156c similar to FIG. 8A. The area of the insulating part 156 around the pad 152b in FIGS. 8B and 8C is a sum of the areas of the insulating parts 156a and 156b or 156c.

FIG. 8D is a schematic plane view showing the circular insulating part 156a around the pad 152b with multiple circular insulating parts (perforation holes) 156b at random around the insulating part 156a. In that case, different from FIG. 8B, it is difficult to find out the centers of the insulating parts 156a and 156b (which are generalized by reference numeral "156"). In that case, the point to be accorded with the center C may be defined as: 1) the center of the pad 152b, 2) the center of gravity (or center) of the insulating part 156a including the pad 152b, or 3) the center of gravity (or center) of the outline of the insulating part 156b. As the distribution of the insulating part 156 spreads as shown in FIG. 8D, some insulating parts 156b may be arranged outside the rectangular area RA. Here, since the number of pads 152b is one, the rectangular area RA would have, for example, a square area of 1.5 mm×1.5 mm or 2 mm×2 mm. Accordingly, after the center is determined, 1) the direction of the rectangular area RA is set so that the rectangular area RA contains as many insulating parts 156 as possible; or 2) so that the line L1 or line W1 in the rectangular area RA set in each conductor layer is parallel to each other (i.e., so that all the rectangular areas RA orientate in the same direction). The keepout and area that depend upon the arrangement of the insulating parts 156 shown in FIG. 8D are similar to FIGS. 8B and 8C.

When the insulating part 156 is formed in the conductive layer, the flatness of a surface of the multilayer structure, such as a bottom surface of the conductive layer $151b_4$ can lower because the strength lowers at the insulating part 156, causing a loose connection with the external substrate. However, when the micro hole parts are formed as shown in FIGS. 8A to 8D, the conductor is arranged on the insulating part 156 and can maintain the strength to some extent and the flatness of the surface of the multilayer structure. In removing the area from the conductor layer, all the conductor (copper) may be removed the center within a predetermined distance as shown in FIG. 5A, or a conductor having a micro hole may be removed from a center within a predetermined distance as shown in FIG. 8A. The micro hole may have a circular, triangular, or a rectangular shape.

FIG. 9A is a graph showing a relationship between the frequency and the area of the insulating part 156 around the pad 152b in the conductive layer $151b_3$ on condition that the other keepouts are set to 0.06 mm or 60 µm. In FIG. 9A, the ordinate axis denotes the maximum frequency band in the frequency loss between −6 dB and −36 dB, and the abscissa axis denotes the area of the insulating part 156 around the pad 152b in the conductive layer $151b_3$. The area of the insulating part 156 in the conventional package board 10 scatters among companies but is about 0.258 mm², and the corresponding frequency is about 3.5 GHz. If it is assumed that the remarkable frequency improvement is 30% in FIG. 9A, the frequency of about 4.6 GHz or greater is sufficient. Therefore, the area of the insulating part 156 around the pad 152b in the conductive layer $151b_3$ is about 0.55 mm or greater. Since the frequency of about 5.5 GHz or greater is more preferable because the frequency of about 5.5 GHz changes its gradient abruptly and exhibits a remarkable frequency improvement, the area of the insulating part 156 around the pad 152b in the conductive layer of $151b_3$ may be about 1.0 mm² or greater. Since the frequency of about 10.1 GHz is a peak of the frequency improvement and thus most preferable, the area of the insulating part 156 around the pad 152b in the conductive layer of $151b_3$ may be about 1.348 mm².

FIG. 9B is a graph showing a relationship between the keepout of the conductive layer $151b_3$ and the frequency on condition that the other keepouts are set to 0.06 mm or 60 µm. In FIG. 9B, the ordinate axis denotes the maximum frequency band in the frequency loss of −20 dB, and the abscissa axis denotes the keepout. The keepout of the conventional package board 10 scatters among companies is but about 0.060 mm, and the corresponding frequency is about 3.5 GHz. If it is assumed that the remarkable frequency improvement is 30% in FIG. 9B, the frequency of about 4.6 GHz or greater is sufficient. Therefore, the keepout of the conductive layer $151b_3$ is about 0.15 mm or greater. Since the frequency of about 5.5 GHz or greater is more preferable because the frequency of about 5.5 GHz changes its gradient abruptly and exhibits a remarkable frequency improvement, the keepout of the conductive layer of $151b_3$ may be about 0.28 mm or greater. Since the frequency of about 10.1 GHz is a peak of the frequency improvement and thus most preferable, the keepout of the conductive layer $151b_3$ may be about 0.36 mm.

When the pad of the conductive layer $151b_3$ is replaced with the pad of the conductive layer $151b_4$, the keepout of the conductive layer $151b_3$ of this embodiment preferably falls between 0 to 120 µm, and the keepout of the conductive layer $151b_3$ of 80 µkm corresponds to the above peek keepout of the conductive layer $151b_3$ of 0.36 mm.

As shown in FIG. 27, the replaced keepout falls preferably between 0 and 120 µm, and more preferably 80 µm (that corresponds to the keepout of about 0.36 mm of the conductive layer $151b_3$) when the pad of the conductive layer $151b_3$ is replaced with the pad of the conductive layer $151b_4$.

Figure 19:
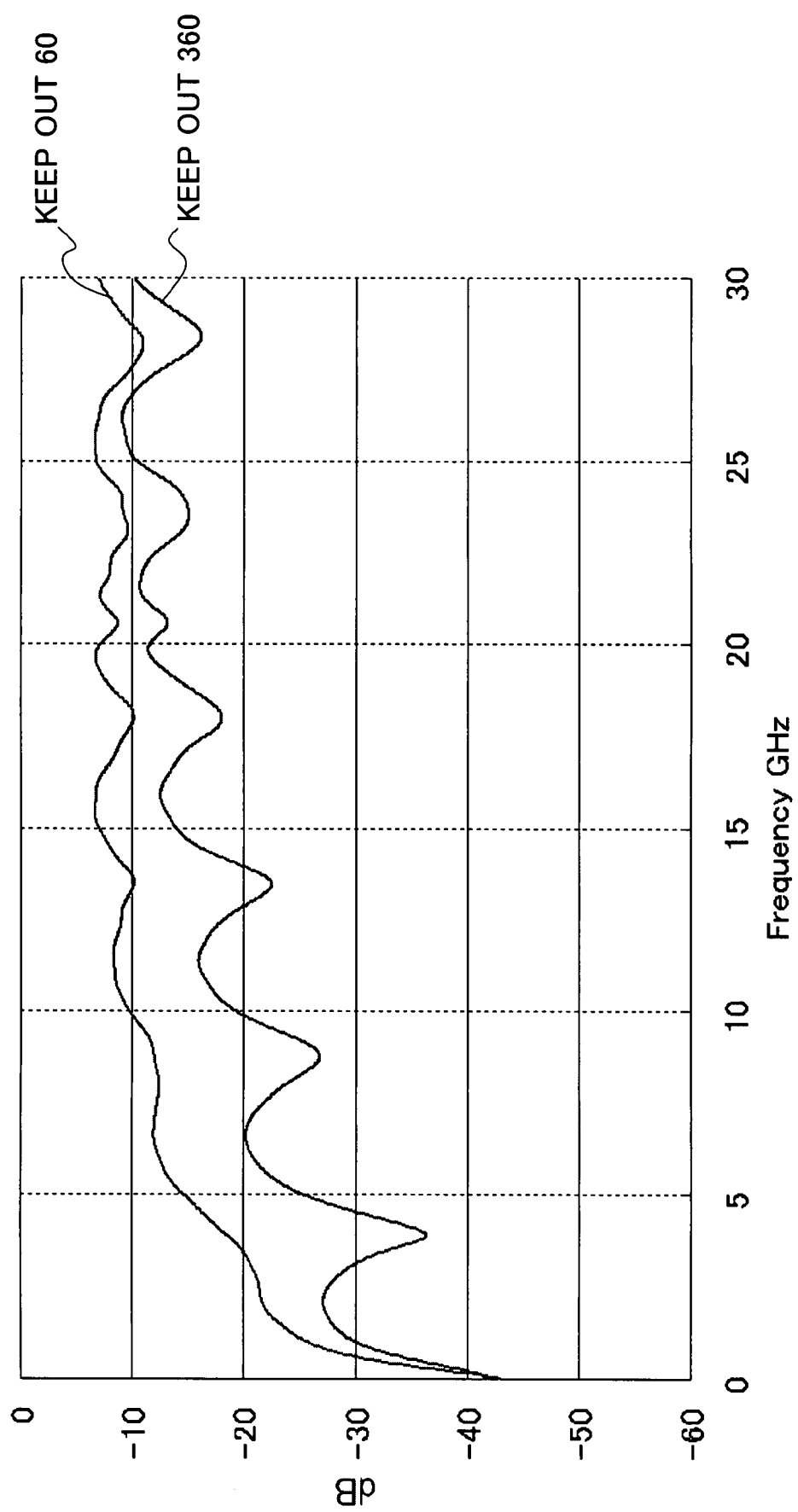
FIG. 19 is a graph that compares a package board that has a second conductive layer (which is the second lowest layer in FIG. 4) with a keepout of 360 μm and other conductive layers with keepouts of 60 μm, with a package board that has all the conductive layers in FIG. 4 with the same keepout of 60 μm.

FIG. 19 is a graph that compares a package board (labeled by "L9 keepout 360") that has the conductive layer $151b_3$ with a keepout of 0.36 mm or 360 µm and other conductive layers with keepouts of 60 µm, with the conventional package board 10 (labeled by "L9 keepout 60") that has all the conductive layers in FIG. 4 with the same keepout of 60 µm. In FIG. 19, the ordinate axis denotes a frequency loss (dB), and the abscissa axis is a frequency (GHz). The frequency of the conventional package board 10 (L9 keepout 60) is 3.42 GHz, and the frequency of the package board 130 of this embodiment (L9 keepout 360) is 9.87 GHz with respect to frequency band of −20 dB. Thus, the L9 keepout 360 improves by about 2.9 times.

Figure 10B:
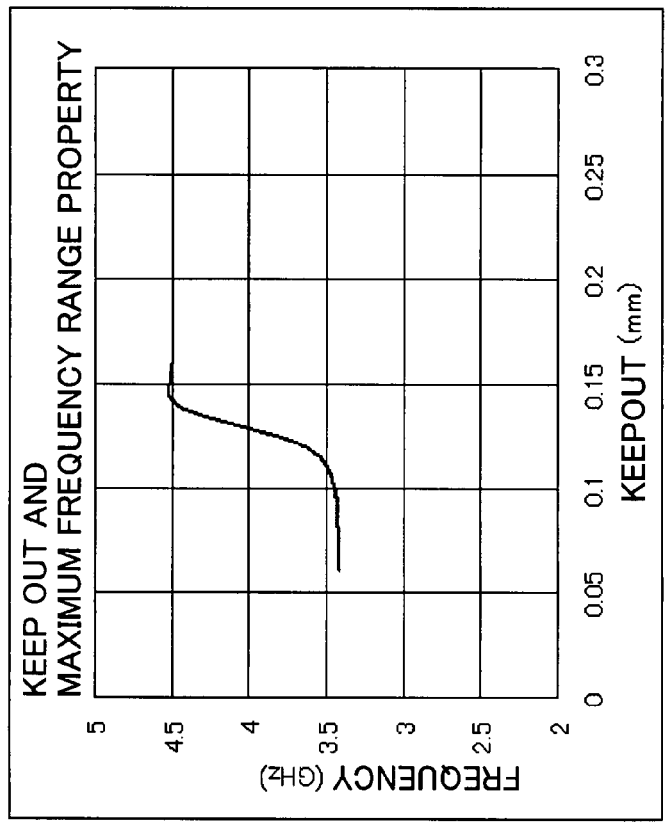
FIG. 10B is a graph showing a relationship between a keepout of the first conductive layer (which is the lowest layer in FIG. 4) and the frequency.
Figure 10A:
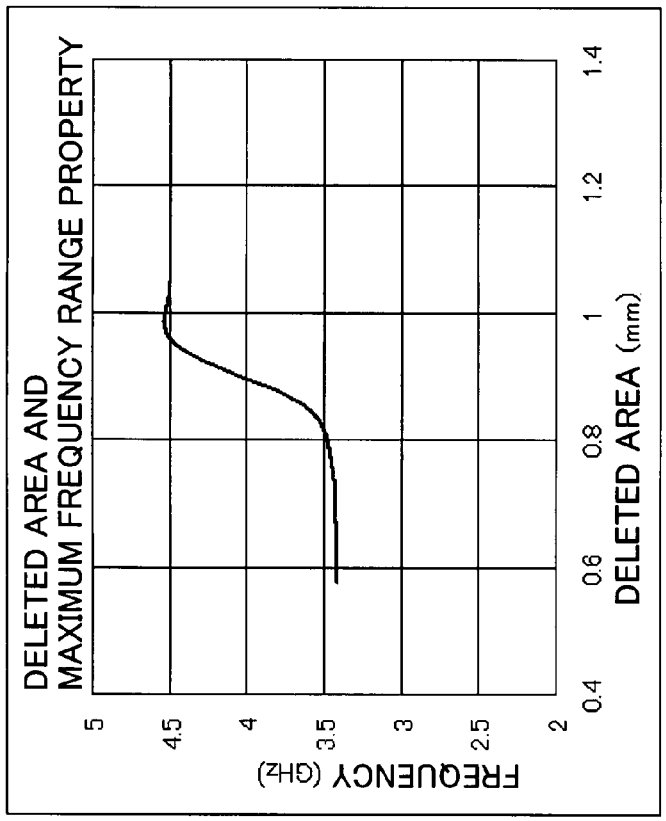
FIG. 10A is a graph showing a relationship between the area of the insulating part in a first conductive layer (which is the lowest layer shown in FIG. 4) and the frequency.

FIG. 10A is a graph showing a relationship between the frequency and the area of the insulating part 156 around the pad 152b in the conductive layer $151b_4$. In FIG. 10A, the ordinate axis denotes the maximum frequency band in the frequency loss of −20 dB, and the abscissa axis denotes the area of the insulating part 156 around the pad 152b in the conductive layer $151b_4$. The area of the insulating part 156 in the conventional package board 10 scatters among companies but is about 0.574 mm², and the corresponding frequency is about 3.4 GHz. If it is assumed that the remarkable frequency improvement is 15% in FIG. 10A, the frequency of about 3.9 GHz or greater is sufficient. Therefore, the area of the insulating part 156 around the pad 152b in the conductive layer $151b_4$ is about 0.90 mm² or greater. Since the frequency of about 4.5 GHz or greater is more preferable because the frequency of about 4.5 GHz changes its gradient abruptly and exhibits a remarkable frequency improvement, the area of the insulating part 156 around the pad 152b in the conductive layer of $151b_4$ may be about 0.95 mm² or greater.

FIG. 10B is a graph showing a relationship between the keepout of the conductive layer $151b_4$ and the frequency. In FIG. 10B, the ordinate axis denotes the maximum frequency band in the frequency loss of −20 dB, and the abscissa axis denotes the keepout. The keepout of the conventional package board 10 scatters among companies but is about 0.060 mm, and the corresponding frequency is about 3.4 GHz. If it is assumed that the remarkable frequency improvement is 15% in FIG. 10B, the frequency of about 3.9 GHz or greater is sufficient. Therefore, the keepout of the conductive layer $151b_4$ is about 0.125 mm or greater. Since the frequency of about 4.5 GHz or greater is more preferable because the frequency of about 4.5 GHz changes its gradient abruptly and exhibits a remarkable frequency improvement, the keepout of the conductive layer of $151b_4$ may be about 0.15 mm or greater.

Figure 20:
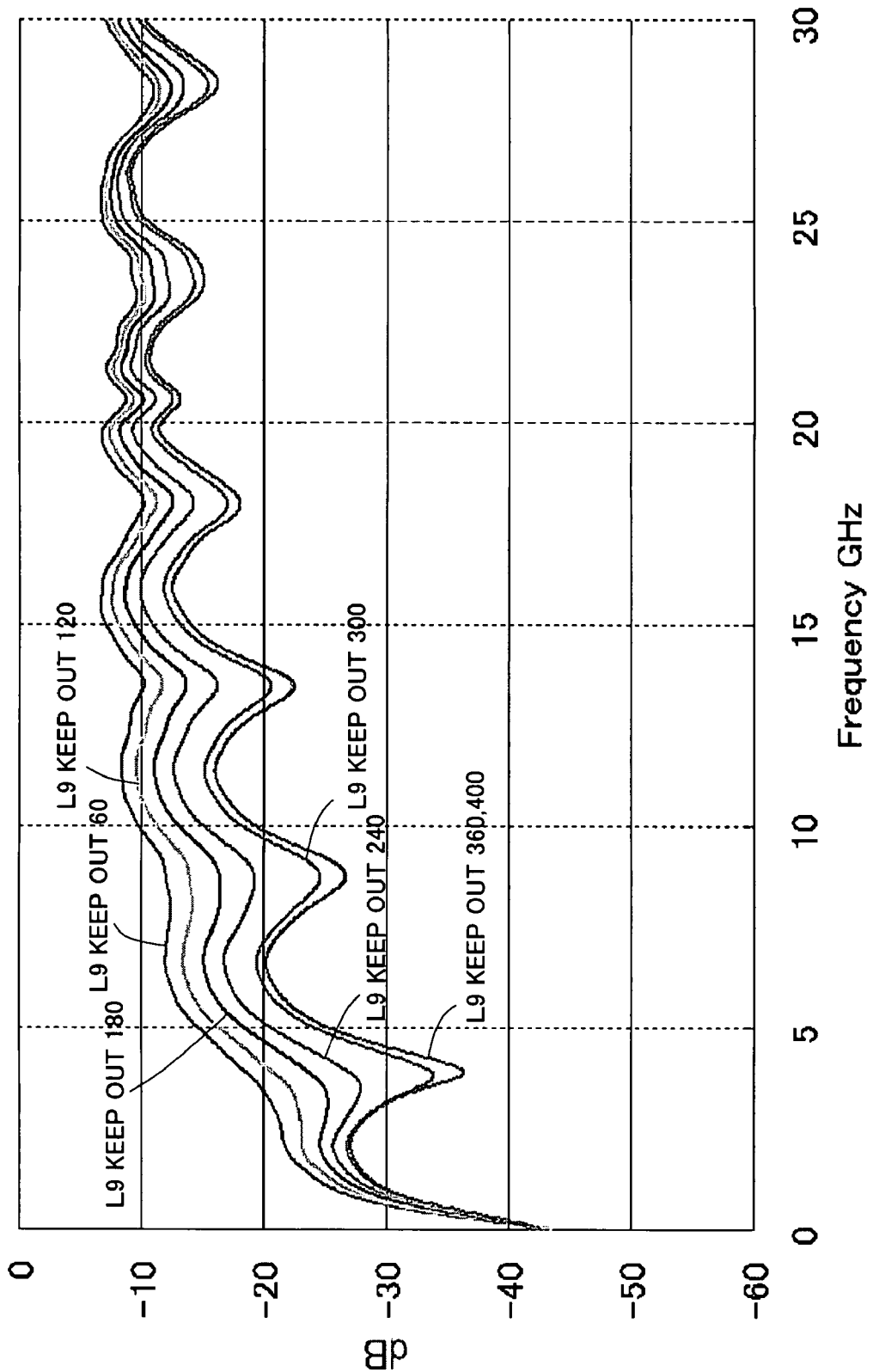
FIG. 20 is a graph that compares a package board that has a second conductive layer (which is the second lowest layer in FIG. 4) with a different keepout, with a package board that has all the conductive layers in FIG. 4 with the same keepout of 60 μm.

The package boards that includes the conductive layer $151b_3$ having keepouts of 120 μm, 180 μm, 240 μm, 300 μm, 360 μm, and 400 μm and other conductive layers having the same keepout of 60 μm will be referred to as L9 keepout 120 to L9 keepout 400 in this order. FIG. 20 is a graph that compares the L9 keepout 120 to the L9 keepout 400 with the conventional package board 10 (having all conductive layers with the same keepout of 60 μm in FIG. 4) (L9 keepout 60). In FIG. 20, the ordinate axis denotes a frequency loss (dB), and the abscissa axis denotes a frequency (GHz). With respect to the frequency loss of −20 dB, the frequency of the conventional package board 10 (L9 keepout 60) is 3.42 GHz, and the L9 keepout 120 to the L9 keepout 400 have frequencies of 4.05 GHz, 4.65 GHz, 5.1 GHz, 6.06 GHz, 9.87 GHz, and 9.87 GHz, and improve by about 1.2 times to about 2.9 times. In addition, in a frequency range between 5 GHz and 20 GHz, the L9 keepout 120 to the L9 keepout 400 are better than L9 keepout 60 by 2 dB or greater.

Thus, according to the simulation result conducted by the instant inventors, the transmission characteristic of the package board 130 improves when the keepout of the conductive layer $151b_3$ is equal to or larger than the keepout of the conductive layer $151b_4$.

Similarly, according to the simulation result by the instant inventors, the transmission characteristic of the package board 130 improves when the keepout for the conductive layer $151b_3$ is set greater than the keepout for each of the conductive layers $151b_1$ and $151b_2$. In particular, according to the simulation result conducted by the instant inventors, the transmission characteristic of the package board 130 improves when the keepout of the conductive layer $151b_2$ is equal to or smaller than (or almost close to) that of the conductive layer $151b_3$.

Figure 21:
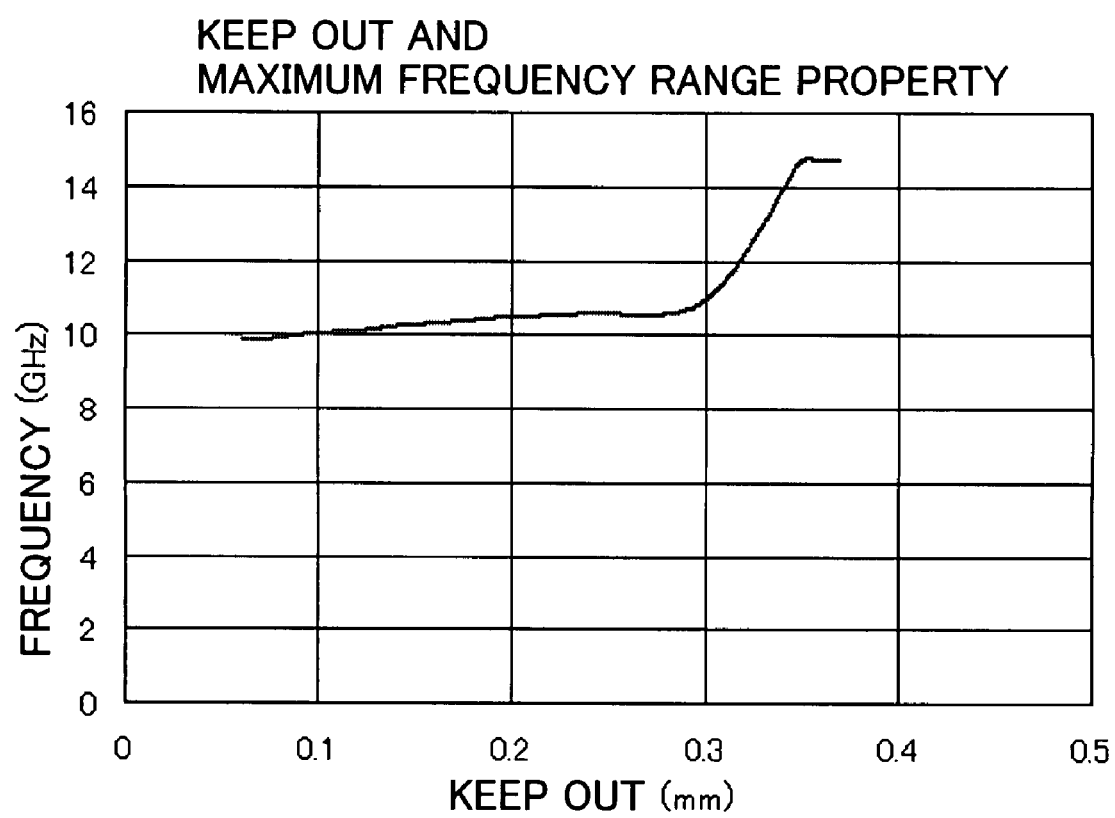
FIG. 21 is a graph of the maximum frequency band with a frequency loss of −20 dB of a package board that sets a keepout of the second conductive layer (which is the second lowest layer in FIG. 4) to 360 μm, and gradually increases a keepout of a third conductive layer (which is the third lowest layer in FIG. 4) from 60 μm.

A package board 130 is prepared which has a conductive layer $151b_3$ with a keepout of 360 μm, and other conductive layers with the same keepout of 60 μm (which is referred to as "L9 keepout 360, L8 keepout 60"). A keepout of the conductive layer $151b_2$ is gradually increased from the "L9 keepout 360, L8 keepout 60," and the maximum frequency in the frequency loss of −20 dB is checked. FIG. 21 shows the result. In FIG. 21, the ordinate axis denotes the maximum frequency in the frequency loss of −20 dB, and the abscissa axis denotes the keepout of the conductive layer $151b_2$. It is understood from FIG. 21 that the gradient of the keepout of the conductive layer $151b_2$ suddenly increases from 300 μm and the keepout of the conductive layer $151b_2$ has a peak at 360 μm.

Figure 22:
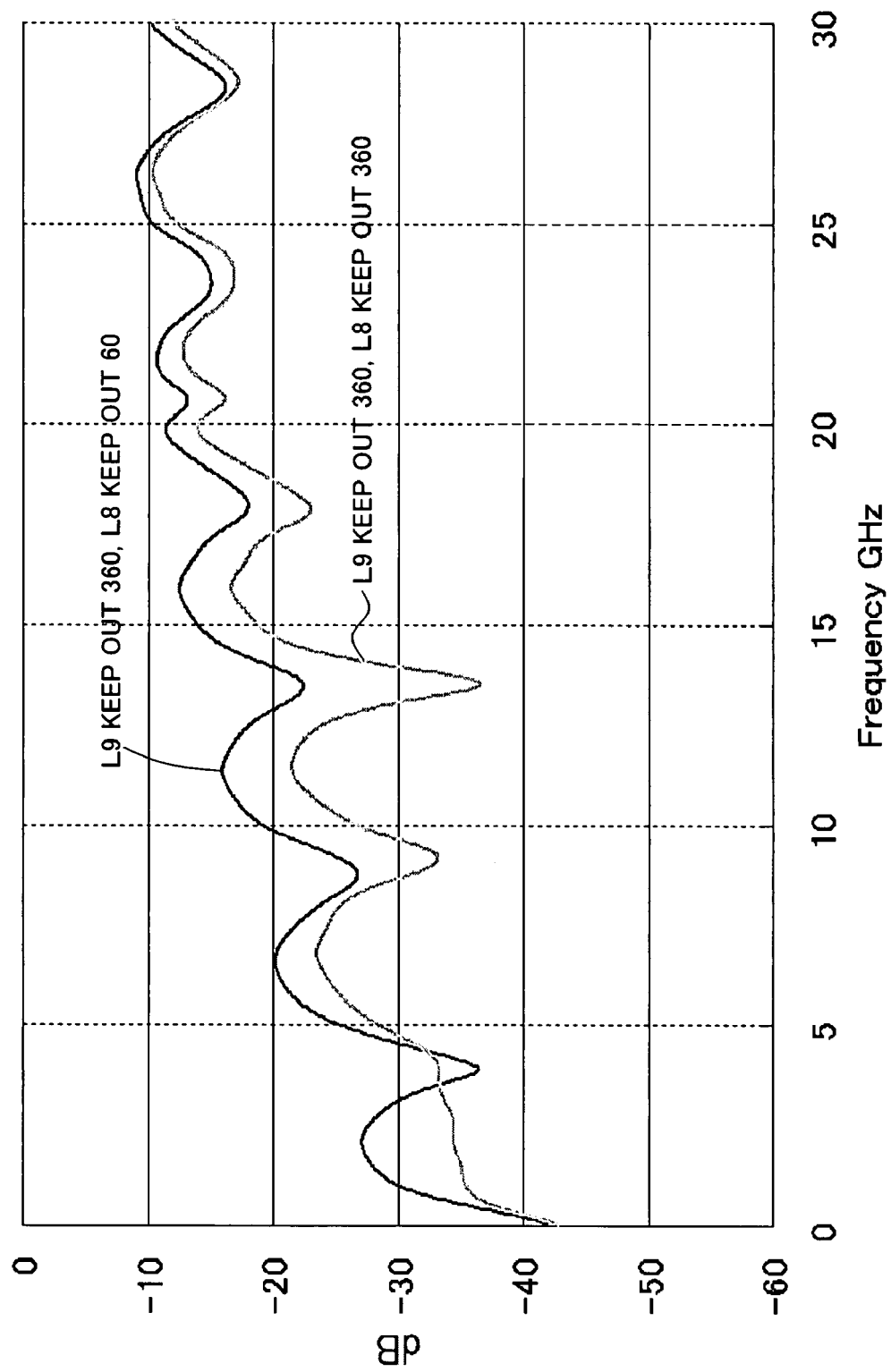
FIG. 22 is a graph that compares a package board that has a second conductive layer (which is the second lowest layer in FIG. 4) with a keepout of 360 μm, and other conductive layers with keepouts of 60 μm, with a package board that has a second conductive layer (which is the second lowest layer in FIG. 4) with a keepout of 360 µm, a third conductive layer (which is the third lowest layer in FIG. 4) with a keepout of 360 µm, and other conductive layers with keepouts of 60 µm.

A package board 130 is prepared which has conductive layers $151b_2$ and $151b_3$ both having the same keepout of 360 μm, and other conductive layers with the same keepout of 60 μm (which is referred to as "L9 keepout 360, L8 keepout 360"). FIG. 22 is a graph that compares "L9 keepout 360, L8 keepout 360" with "L9 keepout 360, L8 keepout 60." In FIG. 22, the ordinate axis denotes the frequency loss (dB), and the abscissa axis denotes the frequency (GHz). With respect to the frequency loss of −20 dB, "L9 keepout 360, L8 keepout 60" has a frequency of 9.87 GHz, and "L9 keepout 360, L8 keepout 360" has a frequency of 14.73 GHz, improving by about 1.5 times.

Figure 23:
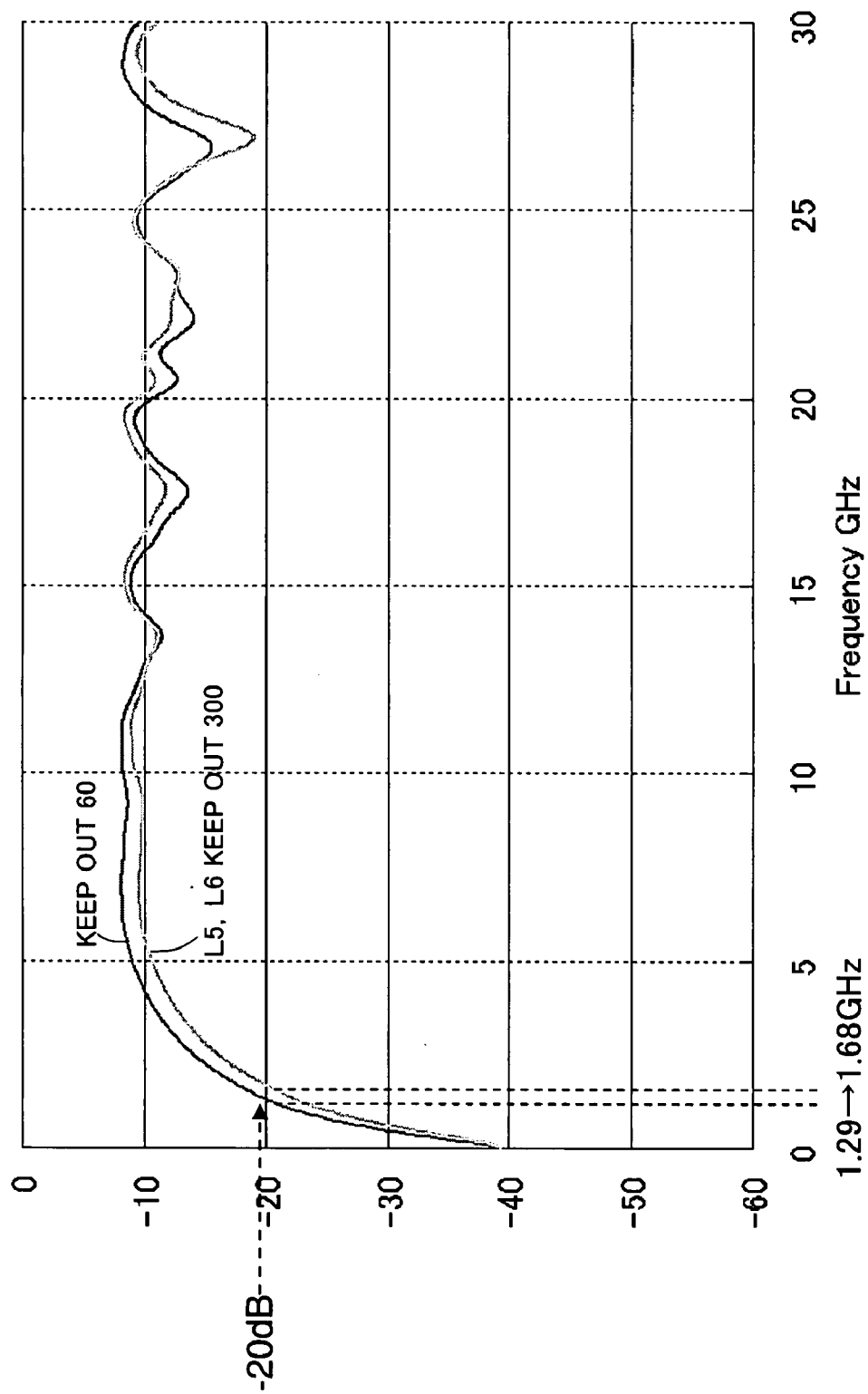
FIG. 23 is a graph that compares a package board that has a core layer having four layers with the same keepout of 60 µm, with a package board that has a core layer having four layers, two outermost layers of which have the same keepout of 300 µm and two inner layers of which have the same keepout of 60 µm.

A description will be given of the multilayer structure of the core layer 140 in which one of the keepouts is increased. In FIG. 23, the core layer 140 has four layers. FIG. 23 is a graph that compares a package board (which will be referred to as "keepout 60") which sets all the keepouts to 60 μm, with a package board (which will be referred to as "L5, L6 keepout 300") which sets the keepouts of the conductive layers 148a and 148b to 300 μm, and the keepouts of other conductive layers to 60 μm. In FIG. 23, the ordinate axis denotes the frequency loss (dB), and the abscissa axis denotes the frequency (GHz). With respect to the frequency loss of −20 dB, keepout 60 has a frequency of 1.29 GHz, and "L5, L6 keepout 300" has a frequency of 1.68 GHz, improving by about 1.3 times.

Figure 24:
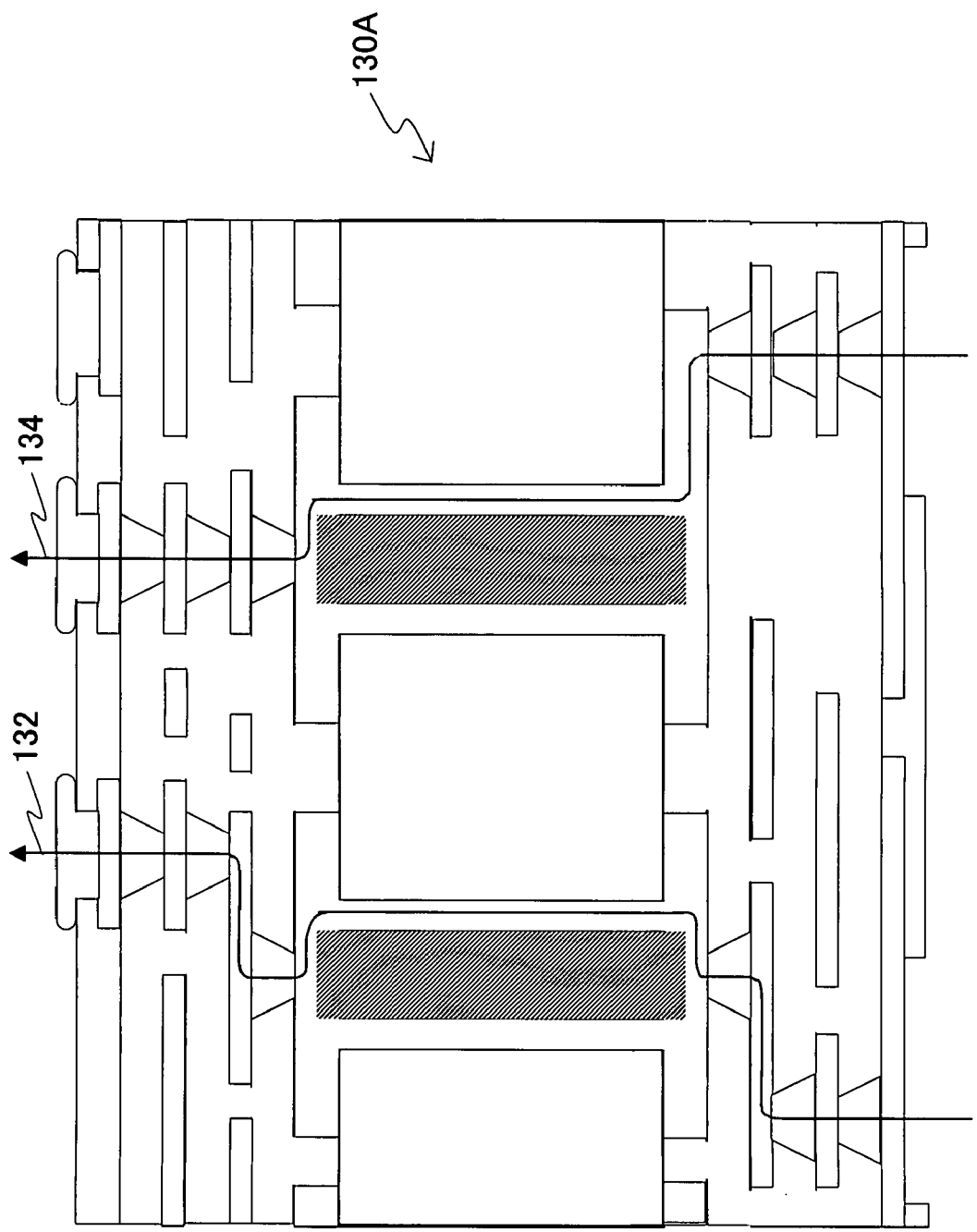
FIG. 24 is a schematic sectional view of a package board having two different keepouts at least at two points on the same layer.

Again the keepout differs at least at two points in the multilayer structure in this embodiment, but these two points are not limited to two layers but may be two points on the same layer. FIG. 24 shows the latter example, and a schematic sectional view of a package board 130A. The package board 130A has two signal transmission channels 132 and 134. The signal transmission channel 132 is a channel for general signal transmissions, and passes conductive layers each having a keepout of 60 μm which is determined by the manufacturing capability (yield) as in the prior art. On the other hand, the signal transmission channel 134 is a channel for high speed signal transmissions, and passes conductive layers that have a keepout greater than 60 μm so as to improve the transmission characteristic.

Figure 25:
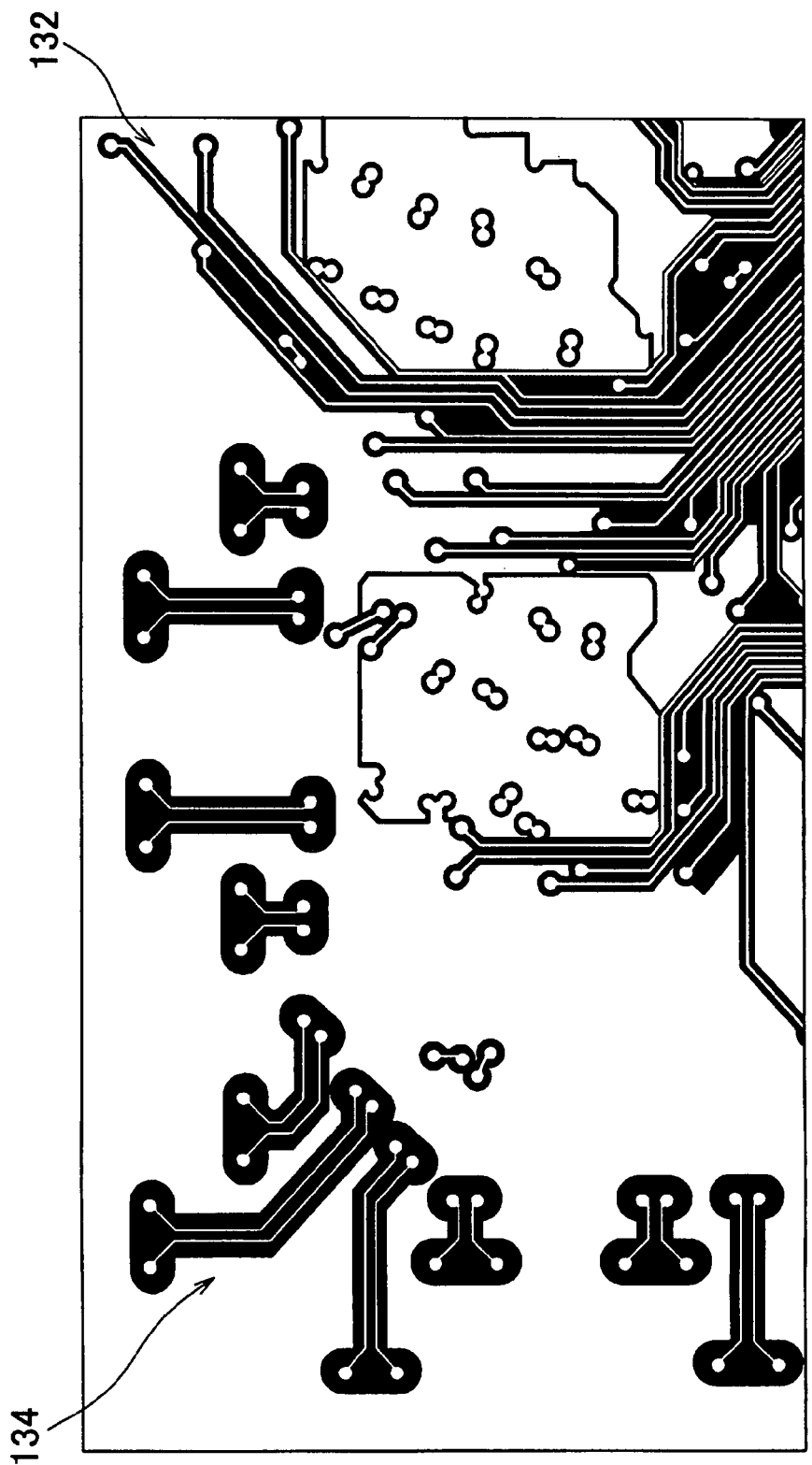
FIG. 25 is a plane view of an illustrative conductive layer having two types of signal transmission channels.

FIG. 25 is a plane view of one illustrative conductive layer having the signal transmission channels 132 and 134. It is understood that the signal transmission channels 132 and 134 have different keepouts. The increased keepout improves the transmission characteristic, and thus the signal transmission channel 134 can improve the signal transmission characteristic. When the keepout differs on the same layer, two types of channels can be formed for high speed transmissions and usual transmissions. This embodiment makes the keepout of the signal transmission channel 134 greater than that of the signal transmission channel 132 in at least one conductive layer.

The BGA balls 180 are ball-shaped soldering bumps or soldering balls, and are arranged in a lattice shape at a connection part to the printed board 200 on the bottom surface of the package board 130. In other words, the BGA balls serve as terminals, and strongly connected to the printed board 200 via soldering.

The heat sink 190 has a base and cooling fins to be connected to the lid 110.

Figure 12:
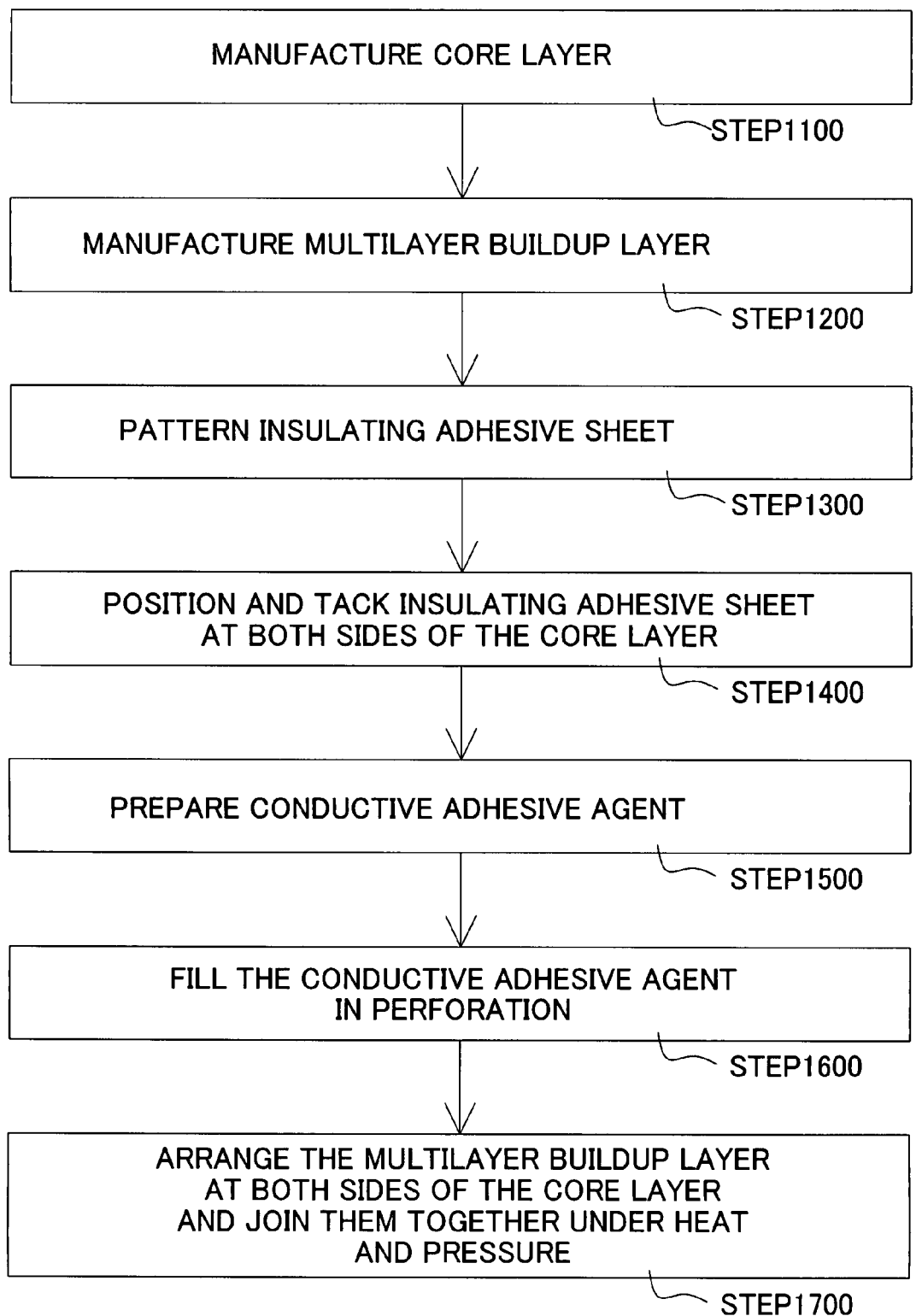
FIG. 12 is a flowchart for explaining a manufacturing method of the package board shown in FIG. 4.

The package board 130 of this embodiment does not significantly modify the conventional manufacturing method, or cause no cost increase. Referring now to FIG. 12, a description will be given of a manufacturing method of the package board 130. Here, FIG. 12 is a flowchart showing the package board 130. For convenience, only the buildup layer 150 has a multilayer structure in the package board 130.

First, a core layer 140 is manufactured (step 1100). The core layer 140 is manufactured by processing a carbon fiber reinforced plastic ("CFRP") plate 141, which is made of a carbon fiber member and a hardening resin composition that houses the carbon fiber member. In manufacturing the CFRP plate 141, a liquid resin composition is impregnated in a sheet of carbon fiber member. Next, the resin composition is dried by maintaining an unhardened state, and carbon fiber reinforced prepreg is produced. Next, the predetermined number of thus produced prepreg sheets are layered and integrated under heat and pressure along the layering direction. Thus, the CFRP plate is produced.

The carbon fiber member is a carbon fiber cross that is made by weaving a carbon fiber thread that bundles carbon fiber, and orientates so that it extends in a direction within a plane of the core layer 140. In this embodiment, plural carbon fiber members are layered in the thickness direction and enclosed by the resin composition. the carbon fiber member may adopt carbon fiber mesh or carbon fiber nonwoven fabric instead of carbon fiber cross.

The resin composition covers, for example, epoxy, polyimide, polycarbonate, polybutylene terephthalate, polyacrylate, polysulfone, etc. Inorganic fillers may be dispersed in the resin composition. Thereby, a coefficient of thermal expansion of the core layer may isotropically reduce in both the in-plane direction and thickness direction.

The insulating resin part 144 shown in FIG. 4 is formed to secure an electric insulation between the carbon fiber member and the through-hole via 142. The insulating resin part 144 can use resin similar to the above resin composition.

The core layer 140 can adjust a coefficient of thermal expansion in the in-plane direction of the core layer by properly adjusting the inclusion ratio of the carbon fiber member. The present invention is applicable to the core layer that has a base material of silicon (Si) or another material. The core layer 140 has positioning holes at four points on the front and back surfaces, e.g., at four corners of the rectangle. The core layer 140 may or may not have a layered structure, but if it may, its pitch is generally greater than the interfacial pitch of the multilayer buildup layer 150.

Figure 13:
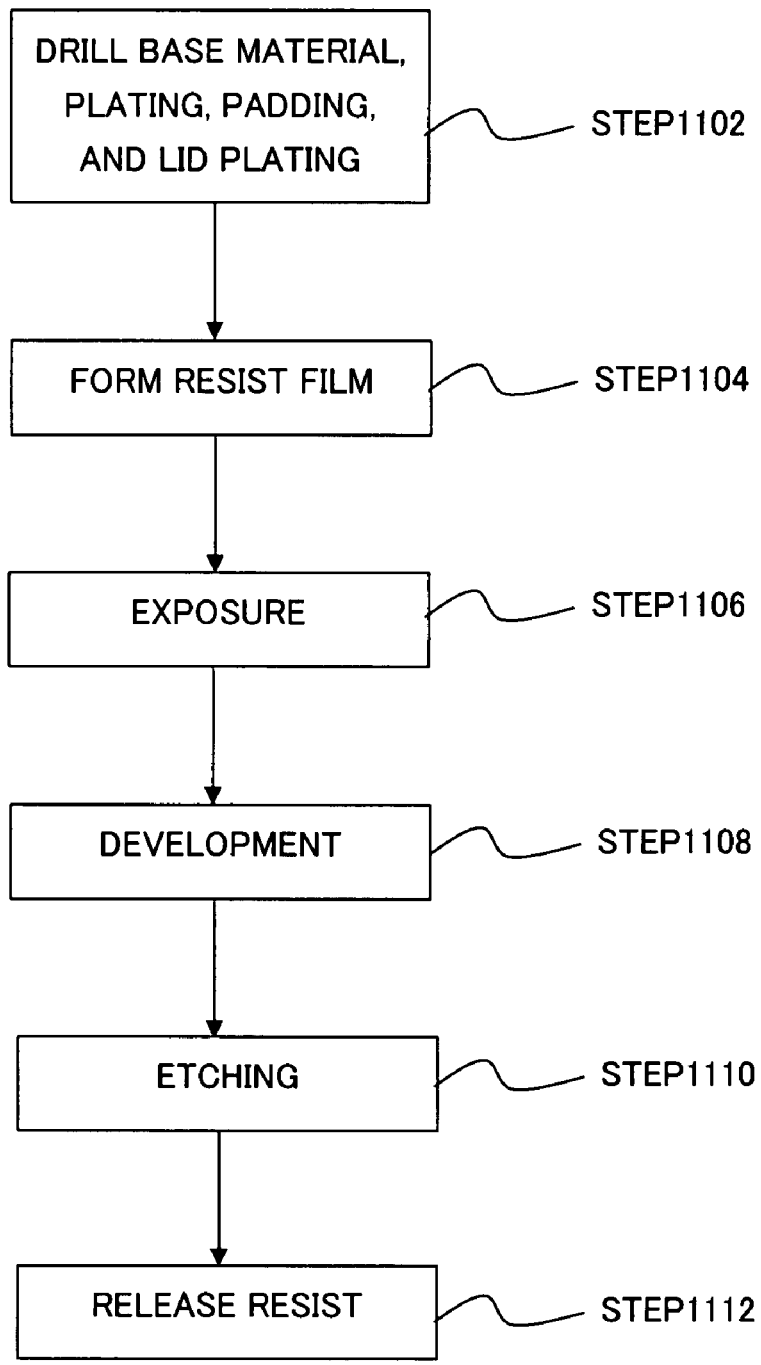
FIG. 13 is a flowchart for explaining the details of step 1100 shown in FIG. 12.

Referring now to FIGS. 13 and 14, a detailed description will be given of the manufacturing step of the core layer 140. Here, FIG. 13 is a flowchart for explaining a manufacturing method (subtractive method) of the core layer 140. FIGS. 14A-14F are schematic sectional views corresponding to the steps in FIG. 13.

Figure 14A:
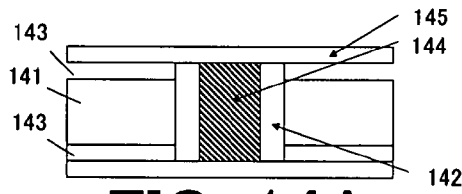
FIGS. 14A to 14F are schematic partially enlarged sectional views of each step in the flowchart shown in FIG. 13.
Figure 14B:
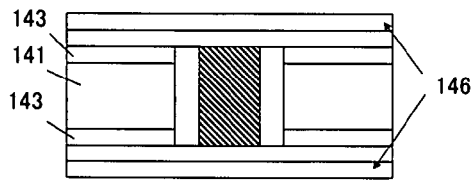

First, a through-hole via is drilled in the base, IVH conductive plating (via 142), resin padding (insulating resin part 144), and lid plating 145 are conducted (step 1102), FIG. 14A). The plating uses copper. The drilling forms a perforation hole at a through-hole expected position in the CFRP plate ("insulation board" hereinafter) 141 covered by copper 143 through the laser processing, and the insulating resin part 144 are formed when the perforation hole is shielded by the insulating resin. The laser processing uses, for example, a pulsed oscillation type carbon dioxide laser. The perforation hole may be formed by polishing through a drill or punching through a punching mold.

Next, the dry film resist ("DFR") 146 is adhered to the front and back lid plate 145 (step 1104). The DFR 146 is, for example, of an alkali development type and has negative-type photosensitivity.

Figure 14C:
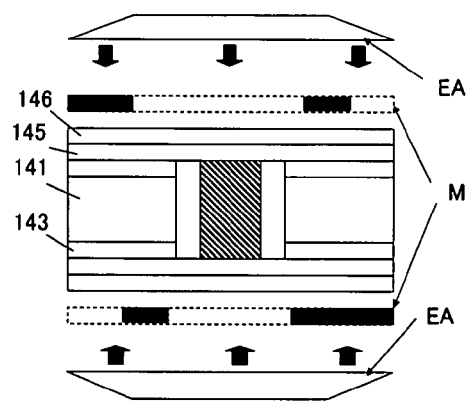

Next, an exposure apparatus EA exposes a mask M onto the DFR 146 (step 1106, FIG. 14C). In that case, at least one of the keepout and the area of the insulating part around the pad can easily been adjusted by adjusting a ratio between the light shielding part and light transmitting part of the mask M, and the transmission characteristic control method and manufacturing method of the multilayer substrate according to the present invention does not increase the cost. The exposure apparatus EA irradiates the UV light into the light transmitting part in the mask, and hardens the DFR 146.

Figure 14D:
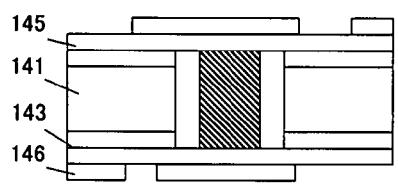
Figure 14E:
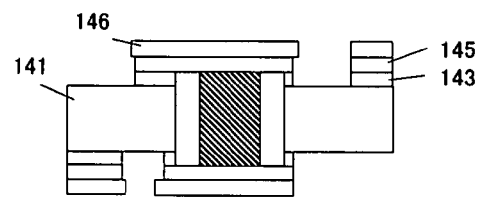
Figure 14F:
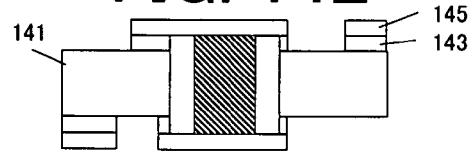

Next follows a development (step 1108, FIG. 14D). The development removes the DFR 146 that corresponds to the light shielding part of the mask M and has not become hardened through the exposure. Next follows etching at part without DFR 146 using acid (step 1110, FIG. 14E). Thereby, a conductive layer having a predetermined circuit pattern is formed on a surface of the core layer 140. The etching solution is, for example, copper chloride. Finally, the DFR 146 is released using the release agent, and the core layer 140 is completed (step 1112, FIG. 14F). The release agent is, for example, alkali release solution. As a result, the lid plate 145 released from the DFR 146 exposes.

Whether the thus manufactured core layer 140 is non-defective is determined before the core layer 140 and the buildup layer 150 are joined together, and only the non-defective one is used for the step 1700 shown in FIG. 2.

Next, the multilayer buildup layer 150 is manufactured (step 1200). The buildup layer 140 has a rectangular shape having an in-plane size similar to the core layer 140 in this embodiment, and four positioning holes (for example, at the corners of the rectangle).

Figure 15:
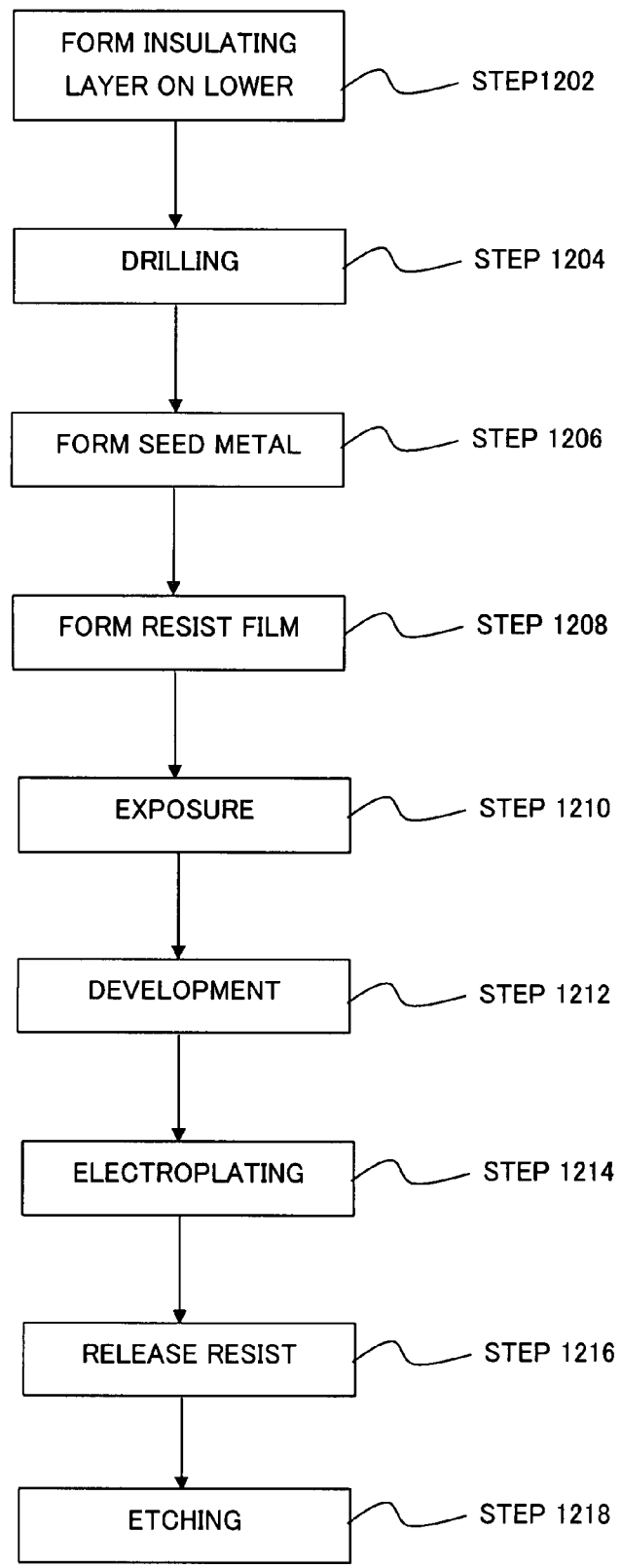
FIG. 15 is a flowchart for explaining the details of step 1200 shown in FIG. 12.

Referring now to FIGS. 15 and 16, a description will be given of the details of the manufacturing step of a buildup layer 150 shown in step 1200. Here, FIG. 15 is a flowchart for explaining the manufacturing method (semi-additive method) of the buildup layer 150. FIGS. 16A-16I are schematic sectional views of the steps in FIG. 15, although FIGS. 16A-16I show only one surface for simplicity.

Figure 16A:
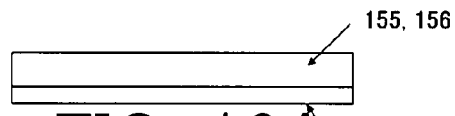
FIGS. 16A to 16I are a schematic partially enlarged sectional views of each step in the flowchart shown in FIG. 15.
Figure 16B:
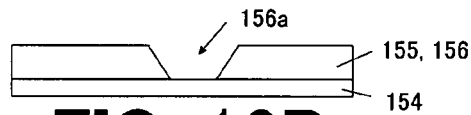
Figure 16C:
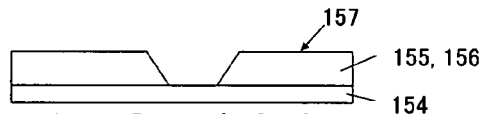
Figure 16D:
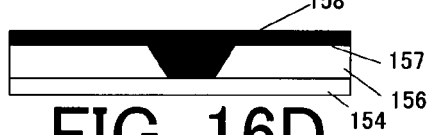

First, the insulating layer (insulating part 156) is formed on the lower layer (step 1202, FIG. 16A). On the lower layer, the pad and signal wiring pattern are actually formed on the lower layer by copper plating. Next, a laser drilling process forms a hole 156d that exposes the conductive part (copper plating) 154 (step 1204, FIG. 16B). The seed metal is formed by the electroless plating 157 over the entire surface (step 1206, FIG. 16C). Next, a film of the DFR 158 is formed (step 1208, FIG. 16D).

Figure 16E:
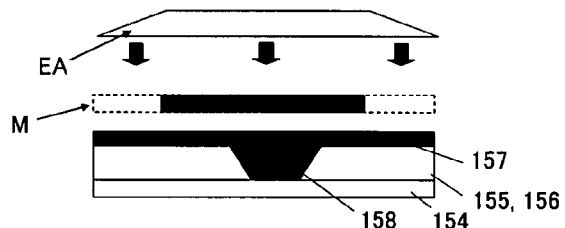
Figure 18:
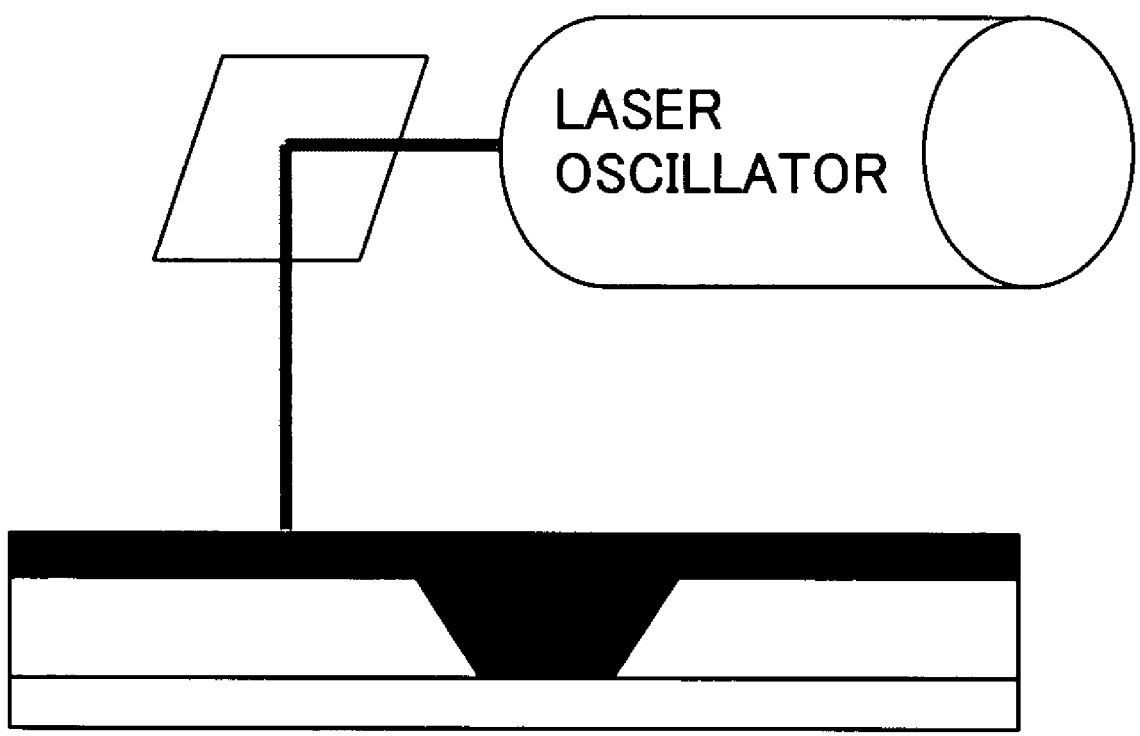
FIG. 18 is a view for explaining a variation of exposure steps shown in FIGS. 14C and 16E.

Next, an exposure apparatus EA exposes a mask M onto the DFR 158 (step 1210, FIG. 16E). In that case, at least one of the keepout and the area of the insulating part around the pad can easily been adjusted by adjusting a ratio between the light shielding part and light transmitting part of the mask M, and the transmission characteristic control method and manufacturing method of the multilayer substrate according to the present invention does not increase the cost. The exposure apparatus EA irradiates the UV light into the light transmitting part in the mask, and hardens the DFR 158. The exposure shown in FIGS. 16E and 14C may be replaced with the direct exposure using a laser oscillator as shown in FIG. 18. In that case, the laser light is irradiated, via a deflection mirror, onto part at which the DFR is to be fixed.

Figure 16F:
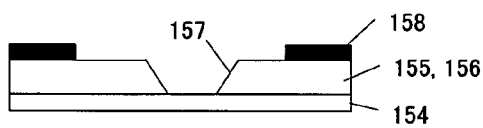
Figure 16G:
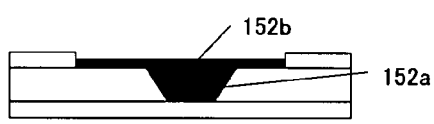
Figure 16H:
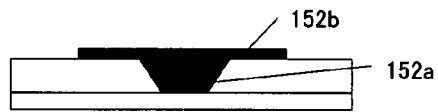
Figure 16I:
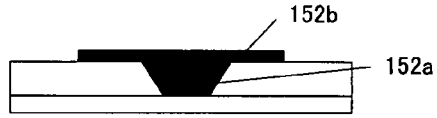

Next follows a development (step 1212, FIG. 16F). The development removes the DFR 158 that corresponds to the light shielding part of the mask M and has not become hardened through the exposure. Next follows electroplating to provide a copper plating pattern at part without DFR 158 (step 1214, FIG. 16G). As a result, the conductive part 154 is formed on the top surface of the insulating part 156, and the hole 156a is shielded by the conductor 154. Next, the DFR 158 is released (step 1216, FIG. 16H), and etching removes seed metal (step 1218, FIG. 16I). Thereafter, steps 1202 to 1218 are repeated and the buildup layer 150 having the necessary number of layers is formed.

Whether the buildup layer 150 is non-defective is determined before the core layer 140 and the buildup layer 150 are joined together, and only the non-defective one is used for the step 1700.

Next, the multilayer buildup layer 150 is manufactured (step 1200). The buildup layer 140 has a rectangular shape having an in-plane size similar to the core layer 140 in this embodiment, and four positioning holes (for example, at the corners of the rectangle).

Next, step 1300 in FIG. 12 patterns the insulation adhesive sheet 160 as shown in FIGS. 17A-17E. The insulating adhesive sheet 160 is made, for example, of epoxy resin, and various types of insulating adhesive sheets are commercially available. The epoxy resin is heat-hardening adhesive and hardens at 150° C. However, the epoxy resin softens at about 80° C. and adheres to the core layer 140, exhibiting a tacking effect.

Figure 17A:
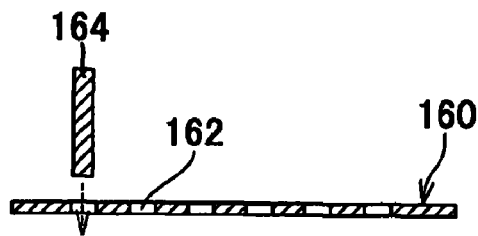
FIGS. 17A to 17E are schematic sectional views of some steps in the flowchart shown in FIG. 12.

The height of the insulating adhesive sheet 160 determines an amount of the conductive adhesive 170. A drill 164 forms a perforation hole 162 in the insulating adhesive sheet 160 at a position that electrically connects the core layer 140 with the buildup layer 150. While FIG. 17A provides the perforation holes 162 at regular intervals, this arrangement is exemplary. The insulating adhesive sheet 160 has a rectangular or circular shape in this embodiment according to the shape of the core layer 140, and four positioning holes (for example, at the corners of the rectangle) on the front and back surfaces.

Figure 17B:
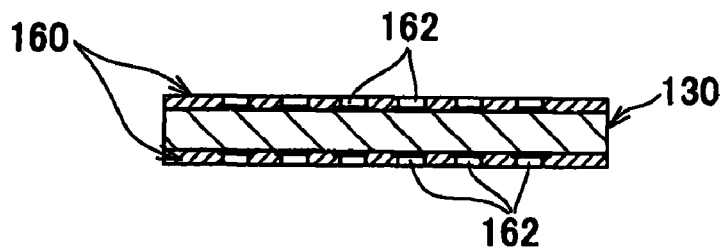

Next, as shown in FIG. 17B, a pair of insulating adhesive sheets 160 are aligned and tacked at both sides of the core layer 140 (step 1400). A perforation hole 162 is aligned with the pad 152b. This embodiment positions the core layer 140 and the insulating adhesive sheet 160 with each other by aligning their positioning holes and inserting pins into them, but the present invention does not limit the alignment method. The adhesive sheet 160 is preliminarily heated, for example, up to about 80° C., and tacked on the core layer 140. The alignment pins are pulled out after heating.

Next, the conductive adhesive 170 is prepared (step 1500). The conductive adhesive contains metallic particles in an adhesive, such as epoxy resin. Each metallic particle has a first melting point, serves as a filler, and is plated with solder having a melting point lower than the filler's melting point. The epoxy resin has the heat-hardening temperature is 150° C. The metallic particle, such as Cu, Ni, etc., has a high melting point. The instant embodiment uses the low-temperature solder consisting of Sn—Bi that has the melting temperature of 138° C. The melting point of the low-temperature solder is preferably higher than the heat-hardening temperature of the adhesive as a base material, so as to prevent the adhesive from heat-hardening before the solder melts.

Figure 17C:
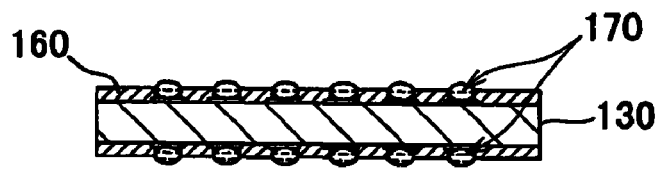

Next, as shown in FIG. 17C, the conductive adhesive 170 fills the perforation hole 162 (step 1600). This embodiment uses screen printing with a metal mask for filling, but the present invention does not limit a type of the filling method.

Figure 17D:
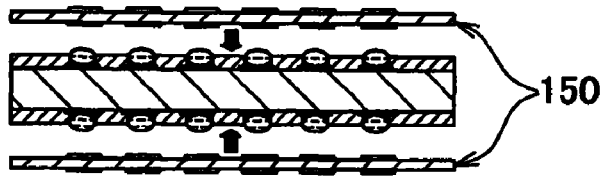
Figure 17E:
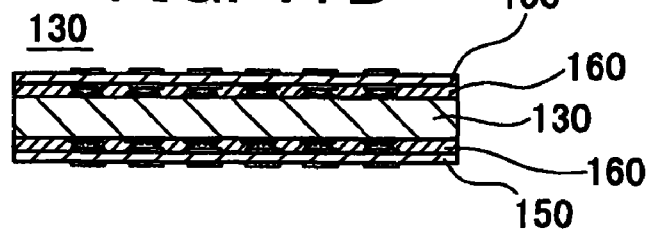

Next, the multilayer buildup layer 150 is aligned at both sides of the core layer 140, as shown in FIG. 17D, and joined to the core layer 140 through heat and pressure (step 1700). The alignment in the instant embodiment is similar to the alignment between the core layer 140 and the adhesive sheet 160. The heating and compression are conducted through pressing under a vacuum environment, as referred to as a vacuum laminate. Thereby, as shown in FIG. 17E, the package board 130 having the core layer 140 and the buildup layer 150 is completed.

The instant embodiment not only determines whether the core layer 140 is non-defective but also determines whether the buildup layer 150 is non-defective, before joining them, and uses only the non-defective core layer 140 and the non-defective buildup layer 150 for joining in the step 1700. The yield improves by determining non-defectiveness before the manufacture of the package board 130 is completed.

Since the low-temperature solder melts at a melting point lower than that of normal solders, the lower melting point reduces the thermal stress and strain that work between the core layer 140 and the buildup layer 150 when the temperature returns to the room temperature from the high temperature, preventing damages of both layers and joint layer. In addition, the high melting point metallic particles makes the melting point of the conductive adhesive 170 higher than that of the low-temperature solder, and thus makes the remelting temperature higher. As a result, the conductive adhesive 170 does not remelt or maintain the reliability of adhesion, even when the subsequent process mounts a circuit device. The metallic particles maintain the conductivity between the core layer 140 and the buildup layer 150.

In operation of the server 300, the transmission characteristic of the package board 130 improves. For example, the present invention can provide a high-performance server 300, since the semiconductor chip 120 can operate in a wider frequency range. Of course, the package module 100 itself ad the printed board 200 mounted with the package module 100 have similar effects.

Further, the present invention is not limited to these preferred embodiments, and various variations and modifications may be made without departing from the scope of the present invention.

The present invention can thus provide a multilayer substrate that improves the transmission characteristic without significantly changing a manufacturing method, an electronic component and an electronic apparatus having the same, a manufacturing method of the multilayer substrate, and a control method of the transmission characteristic of the multilayer substrate.

What is claimed is:

1. A buildup board comprising a buildup layer having a multilayer structure, the multilayer structure including a signal wiring pattern, pads connected to the signal wiring pattern, an insulating part arranged around the pads on the same layer as the pads, and a conductor arranged around the insulating part on the same layer as the pads, wherein the multilayer structure has at least two different keepouts around two of the pads on the same layer, where the keepout is defined as a minimum interval between an outline of one of the pads and the conductor closest to the one of the pads.

2. A buildup board according to claim 1, wherein the keepout is different between at least two layers in the multilayer structure.

3. A buildup board according to claim 1, wherein the multilayer structure includes a first channel used for higher frequency signal transmissions, and a second channel used for transmissions of a lower frequency signal than the first channel, the first channel having a keepout larger than that of the second channel.

4. A buildup board according to claim 1, wherein when the insulating part has plural micro hole parts, the keepout is determined based on a minimum distance between the outline of the pad and an outline of the plural micro hole parts, and the area of the insulating part.

5. A buildup board according to claim 1, wherein the multilayer structure includes a first conductive layer closest to an external printed board, and a second conductive layer closest to the first conductive layer, and
wherein the keepout of the second conductive layer is larger than that of the first conductive layer.

6. A buildup board according to claim 5, wherein the keepout of the second conductive layer falls between 0 to 120 μm when a pad of the second conductive layer is replaced with a pad of the first conductive layer.

7. A buildup board according to claim 5, wherein the second conductive layer has a keepout of 120 μm or greater so as to improve a frequency loss by 2 dB or greater in comparison with the buildup board that includes the second conductive layer with a keepout of 60 μm.

8. A buildup board according to claim 5, wherein the multilayer structure further includes a third conductive layer closest to an external printed board at an opposite side of the first conductive layer with respect to the second conductive layer, and
wherein the keepout of the third conductive layer is equal to or smaller than that of the second conductive layer.

9. A buildup board according to claim 1, wherein the multilayer structure has a pad-cum conductive layer having the pad, and a pad-free conductive layer having the insulating layer and no pad at a position corresponding to the pad of the pad-cum conductive layer.

10. A buildup board according to claim 1, wherein the multilayer structure has a pad-cum conductive layer having the pad, and a pad-free conductive layer having the insulating layer made of plural micro holes, and no pad at a position corresponding to the pad of the pad-cum conductive layer.

11. An electronic component comprising a buildup board according to claim 1.

12. An electronic component according to claim 11, wherein said electronic component is a BGA package.

13. An electronic apparatus comprising an electronic component that includes a buildup board according to claim 1.

14. A buildup board comprising a core layer having a multilayer structure, the multilayer structure including a signal wiring pattern, pads connected to the signal wiring pattern, an insulating part arranged around the pads on the same layer as the pads, and a conductor arranged around the insulating part on the same layer as the pads,
wherein the multilayer structure has at least two different keepouts around two of the pads on the same layer, where the keepout is defined as a minimum interval between an outline of one of the pads and the conductor closest to the one of the pads.

15. An electronic component comprising a buildup board according to claim 14.

16. A buildup board comprising a buildup layer having a multilayer structure including a signal wiring pattern, a conductive layer, and an insulating layer, the conductive layer including a pad connected to the signal wiring pattern, an insulating part arranged around the pad, and a conductor arranged around the insulating part, and the insulating layer including a via, wherein the multilayer structure has at least two different keepouts where the keepout is defined as a minimum interval between an outline of the pad and the conductor closest to the pad on the same conductive layer.

* * * * *